US009239365B2

(12) United States Patent
Oikawa

(10) Patent No.: US 9,239,365 B2
(45) Date of Patent: Jan. 19, 2016

(54) MAGNETIC ELEMENT CONTROL DEVICE, MAGNETIC ELEMENT CONTROL METHOD AND MAGNETIC DETECTION DEVICE

(71) Applicant: FUJIKURA LTD., Tokyo (JP)

(72) Inventor: Yasushi Oikawa, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/559,545

(22) Filed: Dec. 3, 2014

(65) Prior Publication Data

US 2015/0077101 A1   Mar. 19, 2015

Related U.S. Application Data

(63) Continuation of application No. PCT/JP2013/065873, filed on Jun. 7, 2013.

(30) Foreign Application Priority Data

Jun. 8, 2012   (JP) .................................. 2012-130860

(51) Int. Cl.
*G01R 33/02*   (2006.01)
*G01R 33/04*   (2006.01)
*G01R 33/00*   (2006.01)

(52) U.S. Cl.
CPC ............ *G01R 33/04* (2013.01); *G01R 33/0041* (2013.01)

(58) Field of Classification Search
CPC .. G01R 33/028; G01R 33/02; G01R 33/0283; G01R 33/025; G01R 29/0878; G01R 33/04; G01R 33/045; G01R 33/05

USPC .................... 324/258, 253, 66–67, 160–180, 324/71.1–157
See application file for complete search history.

(56) References Cited

U.S. PATENT DOCUMENTS 4,300,095 A   11/1981   Rhodes
5,652,512 A *  7/1997   Feintuch ................ G01R 33/04
                                              324/254

(Continued)

FOREIGN PATENT DOCUMENTS

CN        101228453 A      7/2008
CN        101995559 A      3/2011

(Continued)

OTHER PUBLICATIONS

International Search Report of PCT/JP2013/065873, dated Sep. 10, 2013. [PCT/ISA/210].

(Continued)

*Primary Examiner* — Tung X Nguyen
*Assistant Examiner* — Thang Le
(74) *Attorney, Agent, or Firm* — Sughrue Mion, PLLC

(57) ABSTRACT

A magnetic element control device of the present invention includes an excitation signal generation unit that generates an alternating signal, a feedback signal conversion unit that converts a time width between detection signals of a positive voltage and a negative voltage into voltage information, an adjustment signal generation unit that generates an offset signal that cancels an offset component which is superimposed on a data signal indicating a magnetic field intensity, and an excitation signal adjustment unit that generates an alternating current, a feedback current, and an offset current from the alternating signal, the feedback signal, and the offset signal, respectively, superimposes the feedback current and the offset current on the alternating current, and generates an excitation current which is applied to an exciting coil.

10 Claims, 15 Drawing Sheets

(56) References Cited

U.S. PATENT DOCUMENTS

| | | | | |
|---|---|---|---|---|
| 5,939,881 | A | * | 8/1999 | Slater .................... G01R 33/04 324/253 |
| 6,885,183 | B2 | * | 4/2005 | Kato .................... G01R 15/185 324/117 R |
| 2007/0170916 | A1 | | 7/2007 | Beranger |
| 2009/0230955 | A1 | | 9/2009 | Kejik et al. |
| 2010/0231222 | A1 | * | 9/2010 | Bazinet .................. G01R 33/05 324/345 |
| 2011/0241665 | A1 | | 10/2011 | Takatsuji |

FOREIGN PATENT DOCUMENTS

| | | | |
|---|---|---|---|
| JP | 50-99579 | A | 8/1975 |
| JP | 58-180964 | A | 10/1983 |
| JP | 4-157323 | A | 5/1992 |
| JP | 8-122422 | A | 5/1996 |
| JP | 2005-083868 | A | 3/2005 |
| JP | 2007-78422 | A | 3/2007 |
| JP | 2007-78423 | A | 3/2007 |
| JP | 2007-163424 | A | 6/2007 |
| JP | 2007-199069 | A | 8/2007 |
| JP | 2008-292325 | A | 12/2008 |

OTHER PUBLICATIONS

International Search Report of PCT/JP2013/065869, dated Sep. 17, 2013.
Notice of Allowance of Japanese Patent Application No. 2012-130859, dated Sep. 17, 2013.
Communication dated Mar. 12, 2013, issued by the Japan Patent Office in corresponding Japanese Application No. 2012-130860.
Communication dated Apr. 2, 2013, issued by the Japan Patent Office in corresponding Japanese Application No. 2012-130859.
Communication dated Aug. 13, 2013, issued by the Japan Patent Office in corresponding Japanese Application No. 2012-130860.
Communication dated May 28, 2015, issued by the State Intellectual Property Office of the People's Republic of China in corresponding Chinese Application No. 201380029134.X.
Communication dated Aug. 14, 2015, issued by the U.S. Patent and Trademark Office in corresponding U.S. Appl. No. 14/559,245.

* cited by examiner

MAGNETIC ELEMENT CONTROL DEVICE, MAGNETIC ELEMENT CONTROL METHOD AND MAGNETIC DETECTION DEVICE

CROSS REFERENCE TO RELATED APPLICATIONS

This application is a continuation application based on a PCT Patent Application No. PCT/JP2013/065873, filed Jun. 7, 2013, whose priority is claimed on Japanese Patent Application No. 2012-130860 filed Jun. 8, 2012, the entire contents of which are hereby incorporated by reference.

BACKGROUND OF THE INVENTION

1. Field of the Invention

The present invention relates to a signal processing circuit and a physical quantity measuring device using the signal processing circuit, and particularly relates to a magnetic element control device that drives a time-resolution type fluxgate type (hereinafter, referred to as an FG-type) magnetic element, a magnetic element control method, and a magnetic detection device that detects a magnetic field using the magnetic element control method.

2. Description of the Related Art

Generally, FG-type magnetic elements have a high sensitivity of detecting a magnetic field and are capable of a reduction in size, as compared to Hall elements or magneto-resistive elements which are magnetic elements that detect similar magnetism, and thus are used in azimuth detection devices such as portable electronic devices, and the like.

FIG. 11 is a diagram showing a configuration example of a time-resolution FG-type magnetic element (for magnetic proportion type measurement). As shown in FIG. 11, the FG-type magnetic element is configured such that an excitation winding and a detection winding are wound around the circumferential surface of a magnetic substance core which is formed of a high magnetic permeability material. A region around which the excitation winding is wound is driven by an excitation signal as an exciting coil, and a region around which the detection winding is wound outputs a detection signal as a detection coil.

FIG. 12 is a waveform diagram showing a principle of a magnetic proportion system in which magnetism is detected using the time-resolution FG-type magnetic element. PART (a) of FIG. 12 shows an excitation current which is supplied to the exciting coil of the magnetic element, in which the vertical axis thereof represents the current value of the excitation current, and the horizontal axis thereof represents time. PART (b) of FIG. 12 shows a magnetic flux density of a magnetic field which is generated in the magnetic substance core by the exciting coil of the magnetic element, in which the vertical axis thereof represents magnetic flux density, and the horizontal axis thereof represents time. PART (c) of FIG. 12 shows the voltage value of a pulse which is generated by the detection coil of the magnetic element due to an induced electromotive force, in which the horizontal axis thereof represents time.

In FIG. 12, since the exciting coil is driven, a signal of an excitation current Id (hereinafter, referred to as an excitation signal) is applied between the terminals of the exciting coil, as the excitation signal of an alternating current having a constant cycle, that is, as the excitation signal (that is, triangular wave current signal) having a triangular wave shape as shown in PART (b) of FIG. 12.

Thereby, in the time (positive and negative alternating time zone of the excitation current) at which the direction of the excitation current changes, in the case of PART (c) of FIG. 12, the detection coil generates a positive and negative pulse (a pickup signal, that is, a pu signal) due to an induced electromotive force at time t1 and time t2, and a voltage Vp (pickup voltage) of the pulse is set to a detection signal. The detection signal is continuously generated between the terminals of the detection coil as a pulse having voltages of positive and negative polarities, corresponding to the cycle of the triangular wave current signal.

When a stationary magnetic field Hex (see FIG. 11) passing through a cylindrical space in which the excitation winding and the detection winding of the magnetic substance core are created is applied to the magnetic element, a stationary current corresponding to the stationary magnetic field flows in the excitation winding. That is, the above-mentioned stationary current is superimposed, as an offset, on the excitation current Id of the excitation signal which is applied to the excitation winding.

As a result, the driving state of the exciting coil based on the alternating excitation signal changes due to the offset. That is, the time at which the direction of the flow of the excitation current Id changes varies in a case where the stationary magnetic field Hex is applied and a case where the stationary magnetic field Hex is not applied.

In this case, as shown in PART (c) of FIG. 12, when the stationary magnetic field Hex in the same direction as that of a magnetic field generated by the exciting coil is applied (Hex>0), as compared to a case where the stationary magnetic field Hex is not applied (Hex=0), a value of time t1 becomes smaller at a timing at which the direction of the flow of the excitation current Id changes, and a value of time t2 becomes larger (time Tm becomes shorter than T/2). On the other hand, when the stationary magnetic field Hex in an opposite direction to that of a magnetic field generated by the exciting coil is applied (Hex<0), as compared to a case where the stationary magnetic field Hex is not applied, a value of time t1 becomes larger at a timing at which the direction of the flow of the excitation current Id changes, and a value of time t2 becomes smaller (time Tp becomes longer than T/2).

Thereby, a magnetic flux density $\phi$ in the magnetic substance core changing with a timing at which the direction of the flow of the excitation current Id changes also varies corresponding to the stationary current which is superimposed on the excitation current Id.

When the direction of a magnetic flux changes, an induced electromotive force is generated in the detection coil in a direction in which a change in magnetic flux is canceled. That is, a detection signal is generated as a pulse of a negative voltage at a timing at which the excitation current Id changes from positive to negative. On the other hand, a detection signal is generated as a pulse of a positive voltage at a timing at which the excitation current Id changes from negative to positive.

Therefore, in the FG-type magnetic element, a timing at which the detection signal is output when the stationary magnetic field Hex is not applied is compared with a timing at which the detection signal is output when the stationary magnetic field Hex is applied, thereby allowing the magnitude of the stationary magnetic field Hex to be measured indirectly. That is, when the stationary magnetic field Hex is applied, a specific stationary current flows to a driving coil. Therefore, a constant offset is superimposed on the excitation signal, and a time interval between pulsed detection signals of a negative voltage and a positive voltage changes.

Therefore, magnetic detection devices using the FG-type magnetic element measure the intensity of the stationary magnetic field Hex applied from the outside by measuring a time interval at which the pulsed detection signals of a negative voltage and a positive voltage are generated (see, for example, Japanese Unexamined Patent Applications, First Publications No. 2008-292325, No. 2007-078423, and No. 2007-078422).

Here, the maximum value of the excitation current Id which is applied to the exciting coil is set to a value for which a magnetic field having more than the saturation magnetic flux density of the magnetic substance core is generated. Thereby, the measurement magnetic field range of the magnetic element is determined from the time of one cycle of the excitation signal, and time change (hereinafter, referred to as excitation efficiency) corresponding to the current value of the stationary current as an offset due to the application of the stationary magnetic field Hex.

That is, a period from time t0 to time t3 is one cycle of the excitation signal, and a cycle width is time T. When the stationary magnetic field Hex is not applied (Hex=0), the time from time t1 at which a detection signal of a negative voltage (hereinafter, referred to as a first detection signal) is output to time t2 at which a detection signal of a positive voltage (hereinafter, referred to as a second detection signal) is detected becomes equal to the half cycle of the excitation signal, and thus is set to time T/2.

In addition, when the stationary magnetic field Hex is applied, a time width (hereinafter, referred to as measurement time width) until the first detection signal is output and then the second detection signal is detected changes with respect to time T/2. As shown in FIG. 11, when the magnetic flux direction of the stationary magnetic field Hex is a solid arrow (Hex>0), the direction is the same as the direction of a magnetic flux which is generated by the exciting coil, and thus time width Tm becomes shorter than time T/2 (T0>Tm). On the other hand, when the magnetic flux direction of the stationary magnetic field Hex is a dashed arrow (Hex<0), the direction is opposite to the direction of a magnetic flux which is generated by the exciting coil, and time width Tp becomes longer than time T/2 (Tp>T0). Here, the relation of T0=T/2 is established.

FIG. 13 is a diagram showing a configuration example of a time-resolution FG-type magnetic element (for magnetic balance type measurement). As shown in FIG. 13, unlike the magnetic element of FIG. 11, the FG-type magnetic element in magnetic balance type measurement is configured such that a feedback (hereinafter, referred to as FB) winding coil is wound around the circumferential surface of the magnetic substance core which is formed of a high magnetic permeability material, in addition to the excitation winding and the detection winding. A region around which the excitation winding is wound is driven by an excitation signal as an exciting coil, a region around which the detection winding is wound outputs a detection signal as a detection coil, and a region around which the feedback winding is wound is driven by a feedback signal as an FB coil.

FIG. 14 is a waveform diagram showing a principle of a magnetic balance type measurement in which magnetism is detected using the time-resolution FG-type magnetic element.

PART (a) of FIG. 14 shows an excitation current which is supplied to the exciting coil of the magnetic element, in which the vertical axis thereof represents a current value of the excitation current, and the horizontal axis thereof represents time. The excitation current is a positive and negative alternating signal bordered by a reference current value of 0 A (zero amperes). PART (b) of FIG. 14 shows an FB signal (that is, a feedback signal) which is a current applied to the FB coil of the magnetic element, in which the vertical axis thereof represents a current value of the FB signal, and the horizontal axis thereof represents time. PART (c) of FIG. 14 shows a voltage value of a pulse which is generated by the detection coil of the magnetic element due to an induced electromotive force, in which the horizontal axis thereof represents time.

As shown in FIG. 14, in the case of magnetic balance type measurement, a magnetic field that cancels out the stationary magnetic field Hex (stationary magnetic field passing through the magnetic substance core) which is applied to the magnetic element is generated by the above FB coil. A stationary magnetic field which is applied to the magnetic element is measured from a current value when the magnetic field that cancels out a stationary magnetic field is generated in the FB coil.

In a magnetic balance system, as a coil that generates a magnetic field that cancels out a stationary magnetic field in the magnetic substance core, the above FB coil is provided in the magnetic element, in addition to the exciting coil and the detection coil.

Hereinafter, in this specification, a method in which a stationary magnetic field in the magnetic substance core is canceled by applying an FB signal and in which a magnetic field is measured is referred to as FB control of an FB coil.

In addition, in the case of magnetic balance type measurement, similarly to the magnetic proportion system described previously, a time interval between pulses generated in the detection coil is measured in the positive and negative alternating time zone of the excitation signal which is applied to the exciting coil. The FB signal is applied to the FB coil so that time from time t1 at which the measured detection signal of a negative voltage is output to time t2 at which the detection signal of a positive voltage is detected becomes equal to T/2.

For example, in PART (c) of FIG. 14, when a time width between time t1 and time t2 is larger than T/2, the stationary magnetic field Hex in a negative direction is applied as shown in PART (a) of FIG. 14, and the curve of the excitation signal changes substantially from curve L0 to curve L2. For this reason, since curve L2 of the excitation signal is returned to a position of curve L0 in which the time width between time t1 and time t2 becomes equal to T/2, the FB signal of the current value of line FB2 in PART (b) of FIG. 14 is applied to the FB coil.

On the other hand, in PART (c) of FIG. 14, when the time width between time t1 and time t2 is smaller than T/2, the stationary magnetic field Hex in a positive direction is applied as shown in PART (a) of FIG. 14, and the curve of the excitation signal changes substantially from curve L0 to curve L1. For this reason, since curve L1 of the excitation signal is returned to the position of curve L0, the FB signal of the current value of line FB1 in PART (b) of FIG. 14 is applied to the FB coil.

The intensity of the stationary magnetic field which is applied to the magnetic element is obtained from the current value of the FB signal applied to the FB coil so that the time width between time t1 and time t2 becomes equal to T/2.

Next, FIG. 15 is a block diagram showing a configuration example of a magnetic detection device using a magnetic element control device in FB control of an FB coil. In FIG. 15, a magnetic element 300 is constituted by a detection coil, an exciting coil, and an FB coil.

A magnetic element control device 200 is constituted by a magnetic element control unit 201, a clock signal generation unit 202, and a clock signal adjustment unit 203.

The clock signal generation unit 202 generates a clock of cycle T, and outputs the generated clock to the clock signal adjustment unit 203.

The clock signal adjustment unit 203 adjusts the signal level of the clock to be supplied, and outputs the adjusted clock to the magnetic element control unit 201.

The magnetic element control unit 201 includes a detection signal amplification unit 2012, a detection signal comparison unit 2013, a feedback signal adjustment unit 2014, a feedback signal conversion unit 2015, a data signal conversion unit 2016, an excitation signal adjustment unit 2017, and an excitation signal generation unit 2018.

The excitation signal generation unit 2018 generates a triangular wave as the excitation signal shown in PART (a) of FIG. 14 from the clock which is supplied from the clock signal adjustment unit 203.

The excitation signal adjustment unit 2017 adjusts the voltage level of the excitation signal which is supplied from the excitation signal generation unit 2018, and supplies the adjusted voltage level, as the excitation signal, to the exciting coil.

The exciting coil generates a magnetic field corresponding to the triangular wave within the magnetic substance core of the magnetic element 300.

The detection coil generates a pulse at the positive and negative alternating time zone of the excitation signal in the magnetic substance core.

The detection signal amplification unit 2012 amplifies the voltage level of the pulse which is supplied from the detection coil, and outputs the amplified voltage level, as the detection signal, to the detection signal comparison unit 2013.

The detection signal comparison unit 2013 obtains a difference between T/2 and the time width of the pulse (detection signal) between time t1 and time t2, and outputs the difference to the feedback signal conversion unit 2015.

The feedback signal conversion unit 2015 obtains the current value of the FB signal, supplied to the FB coil, from the supplied difference.

Here, the feedback signal conversion unit 2015 reads out the current value corresponding to the difference from an FB current value table which is previously written and stored in an internal storage unit, and obtains the current value of the FB signal.

The FB current value table is a table indicating the correspondence of the above difference to a current value (digital value) for cancel a stationary magnetic field in the magnetic substance core.

The feedback signal adjustment unit 2014 performs D/A (Digital/Analog) conversion on the current value of the FB signal which is supplied from the feedback signal conversion unit 2015, and outputs the generated current as the FB signal to the FB coil. In addition, the feedback signal adjustment unit 2014 outputs the current value of the FB signal, supplied from the feedback signal conversion unit 2015, to the data signal conversion unit 2016.

The feedback signal adjustment unit 2014 obtains the intensity of the stationary magnetic field canceled in the magnetic substance core, that is, the intensity of the stationary magnetic field Hex applied to the magnetic element 300, from the current value of the FB signal to be supplied. Here, the feedback signal adjustment unit 2014 reads out the magnetic field intensity corresponding to the current value of the FB signal, from a current value magnetic field table which is previously written and stored in an internal storage unit, and obtains the intensity of the magnetic field which is applied to the magnetic element 300. The current value magnetic field table is a table indicating the correspondence of the above current value of the FB signal to the intensity of the applied stationary magnetic field Hex.

When magnetism of the magnetic proportion system is detected using the above-mentioned time-resolution FG-type magnetic element, a measurable magnetic field range is determined by the intensity of the excitation signal and the amount of magnetic field generated per current applied to the coil (hereinafter, referred to as excitation efficiency) which is caused by the material and structure of the magnetic substance core of the magnetic element 300.

When magnetism of the magnetic balance type is detected using the time-resolution FG-type magnetic element, a magnetic field within the magnetic substance core is maintained in an equilibrium state so that the detection signal is output at a constant time interval (T/2) regardless of the stationary magnetic field Hex which is applied to the magnetic element 300. For this reason, a restriction can be performed by the power supply voltage of the entire magnetic element 300, that is, the measurement of the magnetic field can be performed in a range in which the current value of the FB signal is capable of being supplied.

In addition, when magnetism of the magnetic proportion system is detected using the time-resolution FG-type magnetic element, a time interval at which the detection signal is output changes depending on the magnetic field, and thus the linearity of magnetic sensitivity is reflected directly to the characteristics of the magnetic element 300.

On the other hand, when magnetism of the magnetic balance system is detected using the time-resolution FG-type magnetic element, the magnetic field dependency of excitation efficiency is small as the characteristics of the magnetic element, and thus the waveform of the detection signal and the stationarity of a time interval at which the detection signal is generated have a tendency to be maintained.

For this reason, when a measuring object is applied to the magnetic element that measures a magnetic field which is generated by a current of approximately several hundred A (amperes) in the entire measurement current range in a state where linearity is maintained, magnetism detection in the magnetic balance system has been mainly used so far, as compared to the magnetic proportion system.

When magnetism is detected by the magnetic proportion system using the above-mentioned time-resolution FG-type magnetic element, as previously stated, the measurable magnetic field range is restricted by the excitation signal and the excitation efficiency of the magnetic element 300.

For this reason, when the magnetic element which is the magnetic proportion system is applied as a current sensor having a maximum measurement current of approximately several hundred A, the measurement range of a magnetic field capable of obtaining high-accuracy output linearity is restricted due to the restriction of an allowable maximum current value or a power supply voltage used to drive the magnetic element, in addition to the dependency of the output linearity of a single magnetic element on the intensity of a magnetic field.

In addition, when the waveform of the detection signal generated by the detection coil changes depending on the intensity of the stationary magnetic field Hex and the temperature of the magnetic substance core, there is a correlation between the time differential value of a rise in the waveform of the detection signal and the output variation of the detection signal. For this reason, the time variation value of the output of the detection signal changes depending on the intensity of the magnetic field. Thereby, in the measurement of the intensity of a magnetic field, particularly, as the intensity of the magnetic field increases, the time variation value increases, and a magnetic field is not able to be detected with a high degree of accuracy.

On the other hand, when magnetism is detected by the magnetic balance system using the time-resolution FG-type magnetic element, the FB signal is generally performed by current control in FB control of an FB coil.

As previously stated, even when there is a proportional relation between the current value in an FB control signal and the intensity of a magnetic field generated by the current value, and the resistance of the FB coil changes corresponding to a temperature due to the difference in the current value of the FB signal, the current value of the FB signal is controlled at a constant current. For this reason, in the magnetic field having a high intensity in which the current value of the FB signal increases, it is also possible to maintain the sensitivity linearity of the magnetic element.

In addition, even when each excitation efficiency of the exciting coil and the FB coil changes with the individual deviation of the characteristics of the magnetic element, the convergence state of magnetic field equilibrium between the magnetic field generated by the FB signal and the stationary magnetic field Hex applied to the magnetic element 300 is restricted by the characteristics of the control circuit that outputs the FB signal, and a residual error (error) in convergence is not generated.

Further, when the ratio of the excitation efficiency of the exciting coil to the excitation efficiency of the FB coil is held constant, the magnetic sensitivity ratio of the exciting coil to the FB coil does not change, and thus the convergence time until the magnetic field based on the FB signal and the stationary magnetic field reach magnetic field equilibrium also does not change.

Therefore, when the exciting coil and the FB coil in the magnetic element are simultaneously formed by a semiconductor process or the like, a coil resistance ratio is maintained even in a case where each resistance of the exciting coil and the FB coil changes. Thus, a residual error in an equilibrium state which is an index of the convergence of magnetic field equilibrium does not occur, and the time to reach the equilibrium state does not change.

However, when magnetism is detected by the magnetic balance system using the time-resolution FG-type magnetic element, the magnetic element is provided with the FB coil, and thus a reduction in the size of the magnetic element is restricted. In addition, when the FB signal to drive the FB coil controls the intensity of a magnetic field generated by the FB coil based on the current value, the current value corresponding to the intensity of a magnetic field is required to be determined by controlling constant current. For this reason, a voltage-to-current conversion circuit that controls a constant current has to be mounted. Therefore, the circuit size of a control unit that controls a current which is applied to the FB coil becomes larger, and the consumption current also increases.

In addition, an internal reference potential when a constant current in the voltage-to-current conversion circuit is generated fluctuates temporally in association with an increase in the current value of the FB signal, and thus becomes unstable. Therefore, the current value of a constant current to be output fluctuates.

The present invention is contrived in view of such circumstances, and an object thereof is to provide a magnetic element control device, a magnetic element control method and a magnetic detection device in which magnetism of a magnetic balance system employing a time-resolution FG-type magnetic element is detected using a magnetic element constituted by only an exciting coil and a detection coil, and which is provided with an offset adjustment function (same as that of) for a voltage-to-current conversion circuit that provides an excitation signal for current control of an FB coil.

SUMMARY OF THE INVENTION

According to a first aspect of the present invention, there is provided a magnetic element control device that controls a flux-gate type magnetic element when an intensity of a stationary magnetic field which is applied to the magnetic element having an exciting coil and a detection coil is detected using a time-resolution magnetic balance system, including: an excitation signal generation unit that generates an alternating signal; a detection signal comparison unit that detects a detection signal of a positive voltage or a negative voltage which is generated at the detection coil by an induced electromotive force when a direction of an excitation current which flows to the excitation coil switches; a feedback signal conversion unit that converts a time width between detection signals of the positive voltage and the negative voltage into voltage information; a feedback signal adjustment unit that generates a feedback signal that generates a magnetic field that cancels out the stationary magnetic field which is applied to the magnetic element, from the voltage information; a data signal conversion unit that outputs the feedback signal as a data signal indicating a magnetic field intensity; an adjustment signal generation unit that generates an offset signal (signal as a direct current adjustment signal) that cancels out an offset component which is superimposed on the data signal; and an excitation signal adjustment unit that generates an alternating current, a feedback current, and an offset current from the alternating signal, the feedback signal, and the offset signal, respectively, superimposes the feedback current and the offset current on the alternating current, and generates the excitation current which is applied to the exciting coil.

According to a second aspect of the present invention, in the magnetic element control device of the first aspect described above, the offset signal is set to have a voltage which cancels out the offset component which is a difference between a data signal measured in a zero magnetic field and an expectation value of a data signal on a design in the zero magnetic field.

According to a third aspect of the present invention, in the magnetic element control device of the first or second aspect described above, the excitation signal adjustment unit includes a differential amplifier which is configured such that a terminal of the exciting coil is connected to an inverting input terminal and an output terminal, and a reference voltage is applied to a non-inverting input terminal, and the alternating current, the feedback current and the offset current are applied to the inverting input terminal, and the differential amplifier causes an excitation current obtained by adding the alternating current, the feedback current and the offset current to flow from the output terminal to the exciting coil.

According to a fourth aspect of the present invention, the magnetic element control device of the third aspect described above further includes a temperature sensor, and the adjustment signal generation unit performs control on the basis of a temperature measured by the temperature sensor so that the offset current becomes equal to a current value which is set to an initial value, regardless of the temperature.

According to a fifth aspect of the present invention, in the magnetic element control device of the fourth aspect described above, the excitation signal adjustment unit is configured to multiply the alternating signal by a coefficient corresponding to the temperature to correct the alternating signal, superimpose the feedback current on an alternating current determined from the alternating signal after the correction, and supply the superimposed signal, as the excitation current, to the exciting coil.

According to a sixth aspect of the present invention, in the magnetic element control device of the fourth or fifth aspect described above, the excitation signal generation unit is configured to adjust a cycle of the alternating signal in response to the coefficient corresponding to the temperature, superimpose the feedback current on an alternating current generated from the alternating signal after the adjustment, and supply the superimposed signal, as the excitation current, to the exciting coil.

According to a seventh aspect of the present invention, in the magnetic element control device of the first to sixth aspects described above, when a mode in which an intensity of a magnetic field is detected is selected using a time-resolution magnetic proportion system, the feedback signal adjustment unit sets a voltage value of the feedback signal to 0 V and supplies the voltage value to the excitation signal adjustment unit, and the feedback signal conversion unit outputs the time width as measurement data of the stationary magnetic field.

According to an eighth aspect of the present invention, the magnetic element control device of the first to seventh aspects described above further includes: a clock signal generation unit that generates a periodic clock signal; and an excitation signal generation unit that generates a triangular wave signal as the alternating signal synchronized with the clock signal.

According to a ninth aspect of the present invention, there is provided a magnetic element control method of controlling a flux-gate type magnetic element when an intensity of a stationary magnetic field which is applied to the magnetic element having an exciting coil and a detection coil is detected using a time-resolution magnetic balance system, including: an excitation signal generation process of generating an alternating signal; a detection signal comparison process of detecting a detection signal of a positive voltage or a negative voltage which is generated at the detection coil by an induced electromotive force when a direction of an excitation current which flows to the exciting coil switches; a feedback signal conversion process of converting a time width between detection signals of the positive voltage and the negative voltage into voltage information; a feedback signal adjustment process of generating a feedback signal that generates a magnetic field that cancels out the stationary magnetic field which is applied to the magnetic element, from the voltage information; a data signal conversion process of outputting the feedback signal as a data signal indicating a magnetic field intensity; an adjustment signal generation process of generating an offset signal that canceles an offset component which is superimposed on the data signal; and an excitation signal adjustment process of generating an alternating current, a feedback current, and an offset current from the alternating signal, the feedback signal, and the offset signal, respectively, superimposing the feedback current and the offset current on the alternating current, and generating the excitation current which is applied to the exciting coil.

According to a tenth aspect of the present invention, there is provided a magnetic detection device, based on a magnetic balance system, which detects an intensity of a stationary magnetic field to be applied, including: a flux-gate type magnetic element having an exciting coil and a detection coil; an excitation signal generation unit that generates an alternating signal; a detection signal comparison unit that detects a detection signal of a positive voltage or a negative voltage which is generated at the detection coil by an induced electromotive force when a direction of an excitation current which flows to the exciting coil switches; a feedback signal conversion unit that converts a time width between detection signals of the positive voltage and the negative voltage into voltage information; a feedback signal adjustment unit that generates a feedback signal that generates a magnetic field that cancels out the stationary magnetic field which is applied to the magnetic element, from the voltage information; an adjustment signal generation unit that generates an offset signal that cancels out an offset component which is superimposed on the data signal; an excitation signal adjustment unit that generates an alternating current, a feedback current, and an offset current from the alternating signal, the feedback signal, and the offset signal, respectively, superimposes the feedback current and the offset current on the alternating current, and generates the excitation current which is applied to the exciting coil; and a data signal conversion unit that outputs the feedback signal as a data signal indicating a magnetic field intensity.

According to the aspects of the present invention described above, since the feedback signal of the voltage value for generating a magnetic field that cancels out the stationary magnetic field is superimposed on the excitation signal, and the feedback signal when the stationary magnetic field is canceled (magnetic intensity is set to 0) is used as measurement data indicating a magnetic field intensity, the magnetic field intensity of a magnetic balance system can be measured using the magnetic element (magnetic element constituted by the exciting coil and the detection coil without an FB coil) having the same structure as that of a magnetic proportion system.

Therefore, according to the aspects of the present invention, it is possible to reduce the size of the magnetic element used in the magnetic detection device. Therefore, it is possible to realize a reduction in the size of the magnetic detection device, and to reduce manufacturing costs through a reduction in the size thereof.

DETAILED DESCRIPTION OF THE PREFERRED EMBODIMENTS

First Embodiment

Figure 1:
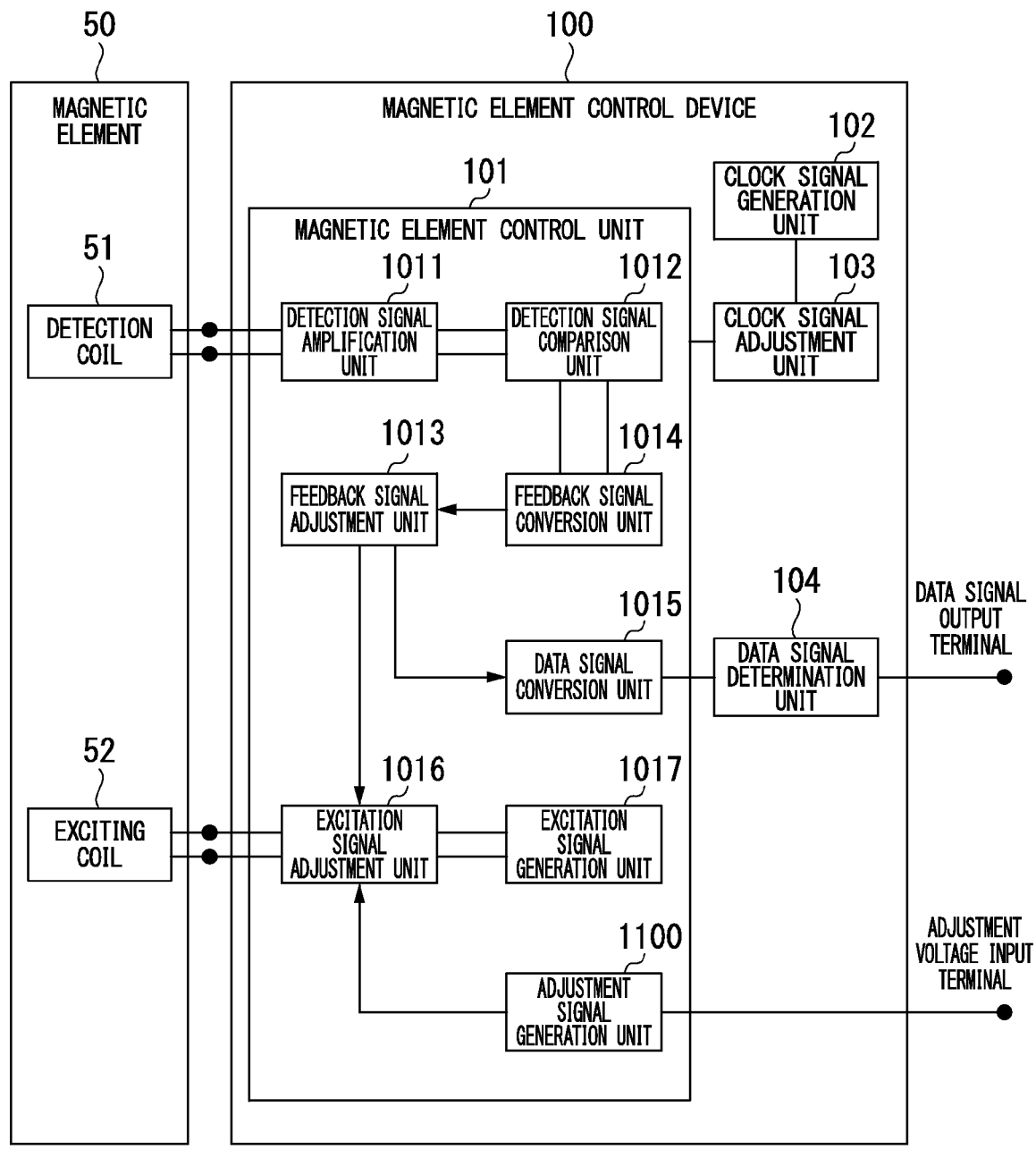
FIG. 1 is a diagram showing a configuration of a magnetic detection device constituted by a magnetic element control device 100 and a magnetic element 50 according to a first embodiment of the present invention.

Hereinafter, a first embodiment of the present invention will be described with reference to the accompanying drawings. FIG. 1 is a diagram showing a configuration of a magnetic detection device constituted by a magnetic element control device 100 and a magnetic element 50 according to the first embodiment of the present invention. The magnetic element control device 100 includes a magnetic element control unit 101, a clock signal generation unit 102, a clock signal adjustment unit 103, and a data signal determination unit 104.

When the intensity of a stationary magnetic field which is applied to the flux-gate type magnetic element 50 constituted by a detection coil 51 and an exciting coil 52 is detected using a time-resolution magnetic balance system, the magnetic element control device 100 according to the present embodiment controls an excitation signal which is applied to the exciting coil 52.

The magnetic element control unit 101 includes a detection signal amplification unit 1011, a detection signal comparison unit 1012, a feedback signal adjustment unit 1013, a feedback signal conversion unit 1014, a data signal conversion unit 1015, an excitation signal adjustment unit 1016, an excitation signal generation unit 1017 and an adjustment signal generation unit 1100.

The clock signal generation unit 102 is constituted by an oscillator that generates a clock signal having a predetermined cycle, and outputs a generated clock signal to the clock signal adjustment unit 103.

The clock signal adjustment unit 103 amplifies the signal level of a clock signal to be supplied, or performs processing such as a change in the cycle of the clock signal, and outputs a clock signal of a processing result to the excitation signal generation unit 1017.

The data signal determination unit 104 determines whether the voltage value of a data signal indicating the intensity of a magnetic field which is supplied from the data signal conversion unit 1015 (described later in detail) is included in a data range (designated range of output data) which is set in advance. The above data range is previously written and stored in an internal storage unit of the data signal determination unit 104. The data range refers to a range of a voltage value for determining whether a voltage value indicating a data signal which is amplified and output in the data signal conversion unit 1015 is included in a region in which a magnetic field and a voltage value indicating the magnetic field are in a linear relation.

When the voltage value of the data signal is not included in the data range, the data signal determination unit 104 outputs an error signal which is a data signal indicating an error to an external magnetic field intensity determination device. In addition, when the voltage value of the data signal is included in the data range, the data signal determination unit 104 outputs a data signal indicating a voltage value to the external magnetic field intensity determination device through a data signal output terminal.

In the magnetic element control unit 101, the excitation signal generation unit 1017 generates a triangular wave signal as an alternating signal, for example, an alternating voltage signal that alternates using 0 V as a reference potential, on the basis of a clock signal which is supplied from the clock signal adjustment unit 103.

The excitation signal adjustment unit 1016 amplifies the triangular wave signal, generated by the excitation signal generation unit 1017, at a predetermined amplification factor, generates a triangular wave current signal, and applies the generated signal to the exciting coil 52.

The excitation signal adjustment unit 1016 adds components of a feedback current If and an offset current Ia which is a direct-current adjustment current, described later, to the triangular wave current signal which is applied to the exciting coil 52.

Figure 2:
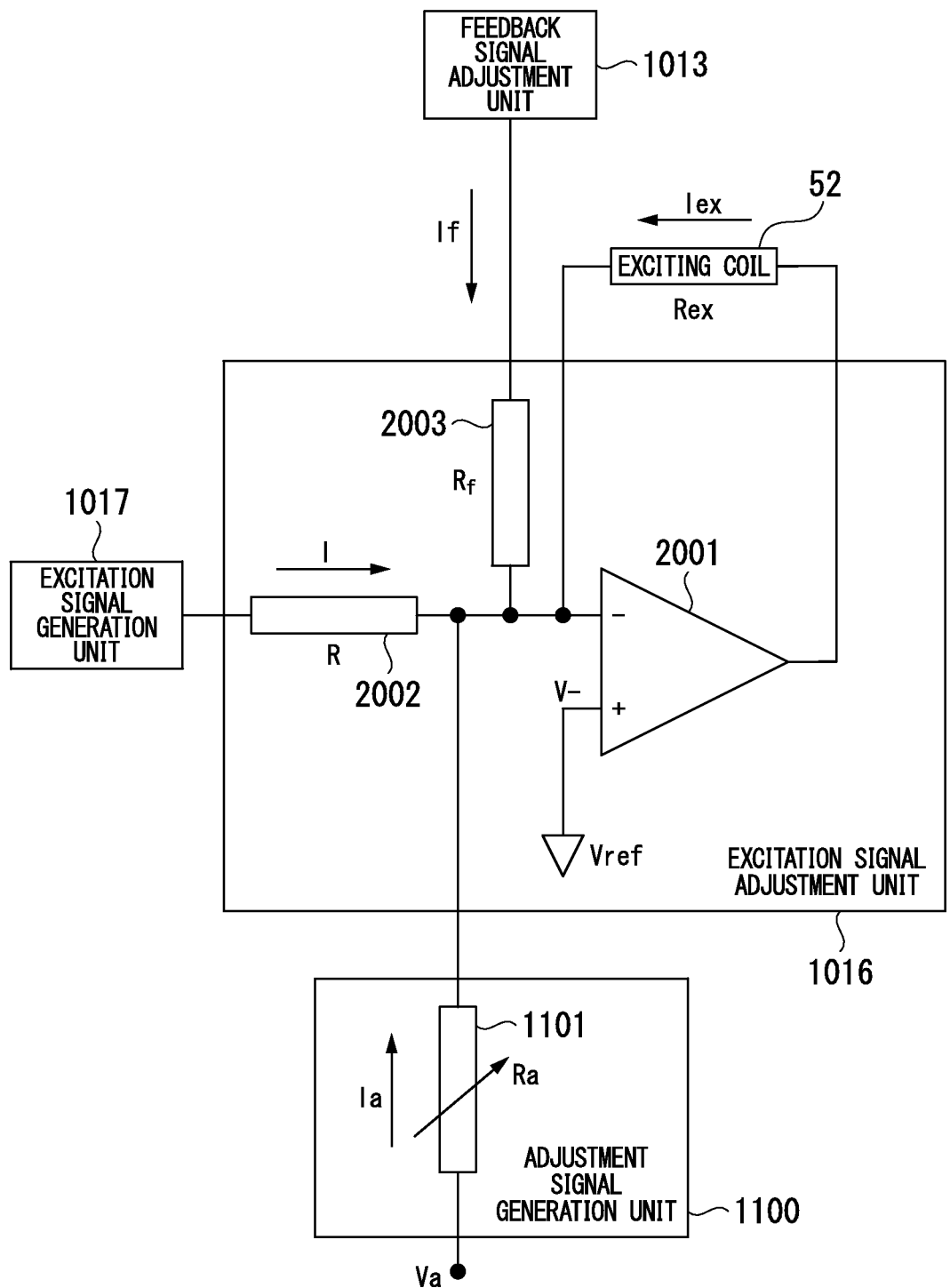
FIG. 2 is a diagram showing a configuration example of an excitation signal adjustment unit 1016 and an adjustment signal generation unit 1100 in FIG. 1.

FIG. 2 is a diagram showing a configuration example of the excitation signal adjustment unit 1016 and the adjustment signal generation unit 1100 in FIG. 1. In FIG. 2, the excitation signal adjustment unit 1016 includes a differential amplifier 2001, and resistors 2002 and 2003. Here, the resistance value of the resistor 2002 is a resistance value R, and the resistance value of the resistor 2003 is a resistance value Rf. The resistor 2002 is interposed between the output terminal of the excitation signal generation unit 1017 and the (−) terminal (inverting input terminal) of the differential amplifier 2001, and performs voltage-current conversion on the voltage of the triangular wave excitation signal which is output by the excitation signal generation unit 1017 to thereby obtain a drive current I. The resistor 2003 is interposed between the output terminal of the feedback signal adjustment unit 1013 and the (−) terminal of the differential amplifier 2001, performs voltage-current conversion on the voltage (feedback voltage) of a feedback signal which is output by the feedback signal adjustment unit 1013 to thereby obtain a feedback current If, and outputs the current to the (−) terminal of the differential amplifier 2001. In addition, in the resistor 2003, the resistance value Rf is set so that the current value of the feedback current If corresponds to the shift amount of a magnetic field indicated by the feedback voltage and has a current value which changes an excitation current Iex.

Meanwhile, in the present embodiment, a description is given in which the feedback signal which is output by the feedback signal adjustment unit 1013 is a voltage control signal, but the feedback signal may be a current control signal. Alternatively, the feedback signal may include both the voltage control signal and the current control signal.

In addition, the (+) terminal (non-inverting input terminal) of the differential amplifier 2001 is connected to the output terminal of the adjustment signal generation unit 1100. The adjustment signal generation unit 1100 is a circuit that outputs a constant current. The adjustment signal generation unit 1100 generates an offset current Ia as the constant current. That is, the adjustment signal generation unit 1100 includes a variable resistor 1101, performs voltage-current conversion on an offset voltage Va (offset signal which is a direct current adjustment signal) which is a direct current adjustment voltage supplied from the input terminal, using the variable resistor 1101 having a resistance value Ra, and outputs the resultant, as the offset current Ia, from the output terminal to the (−) terminal of the differential amplifier 2001. The offset voltage Va is supplied from an external power supply (not shown) through an adjustment voltage input terminal. In addition, a power supply that supplies the offset voltage Va may be provided in the inside of the magnetic element control device 100.

In addition, the differential amplifier 2001 is configured such that the terminals of the exciting coil 52 are respectively connected to the output terminal and the (−) terminal of the amplifier. The resistance value of the exciting coil 52 is Rex, and Iex is applied from the output terminal of the differential amplifier 2001, as the excitation current of the triangular wave current signal.

With such a configuration, the excitation current Iex flowing to the exciting coil 52 is the above-mentioned triangular wave current signal, and becomes equal to an addition value of a drive current I (alternating current obtained by performing voltage-current conversion on the triangular wave voltage signal), the feedback current If, and the offset current Ia.

The offset current Ia is a current into which the offset voltage Va given from the outside is converted by the variable resistor 1101. The offset voltage Va is a voltage which cancels out an offset (offset component in magnetic intensity data) superimposed on a data signal which is generated by the manufacturing variation of the magnetic element 50, and a circuit element which constitutes the magnetic element control unit 101, the clock signal generation unit 102, the clock signal adjustment unit 103 and the data signal determination unit 104 in the magnetic element control device 100.

That is, when the magnetic detection device is encased in a magnetic shielding box having a stationary magnetic field Hex of "0" basically in case the above-mentioned circuit element is created as designed, and a magnetic field is measured, the data signal has a numerical value indicating that the magnetism is "0". In addition, the temperature when this offset is measured is set to room temperature.

However, as described above, even when the stationary magnetic field Hex is "0" due to the manufacturing variation of the circuit element, the data signal may not have a value indicating that the magnetic intensity is "0".

That is, in a case of the design of the magnetic element control device 100, the magnetic intensity of the data signal is expected to be "0", but may not be "0" which is an expectation value due to the variation of the characteristics of the above-mentioned circuit element or the like. In this case, in a state (room temperature) where the stationary magnetic field Hex is "0", correction processing of adjusting the offset voltage Va to a voltage in which the data signal has a value indicating "0" is performed. In this case, the resistance value Ra of the variable resistor 1101 is constant, but both the offset voltage Va and the resistance value Ra may be adjusted. Thereby, the offset current Ia indicating a magnetic field intensity corresponding to the offset superimposed on the data signal flows to the (−) terminal of the differential amplifier 2001 in FIG. 2. The feedback current If including a current that cancels the offset current Ia flows, and thus the feedback current If, that is, the feedback voltage is corrected by the offset current Ia, thereby allowing the offset superimposed on the data signal to be canceled.

Figure 3:
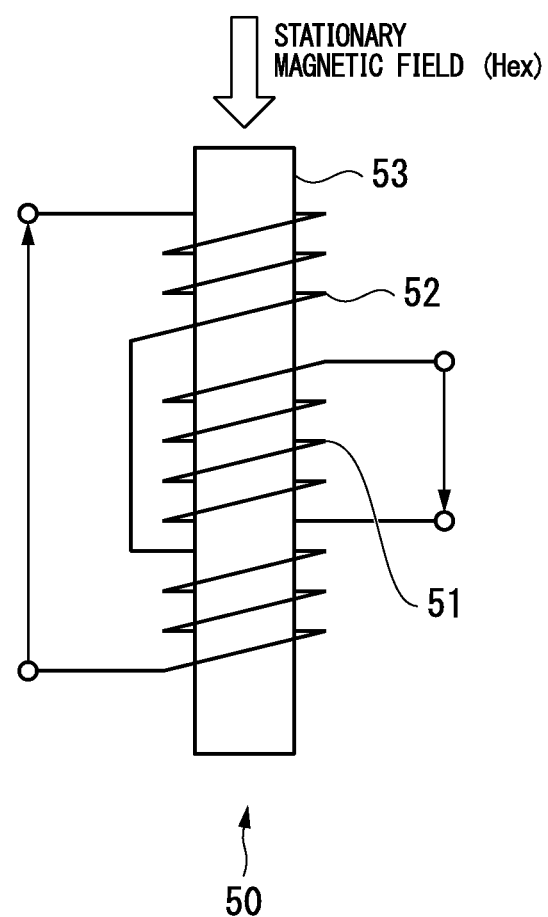
FIG. 3 is a diagram showing a configuration example of a magnetic element 50 which is a flux-gate type magnetic element.

FIG. 3 is a diagram showing a configuration example of the magnetic element 50 which is a flux-gate (FG) type magnetic element.

The magnetic element 50 is configured such that two types of windings are wound with respect to a magnetic substance core 53, and is constituted by the detection coil 51 formed of one type of winding and the exciting coil 52 formed of another type of winding.

Figure 4:
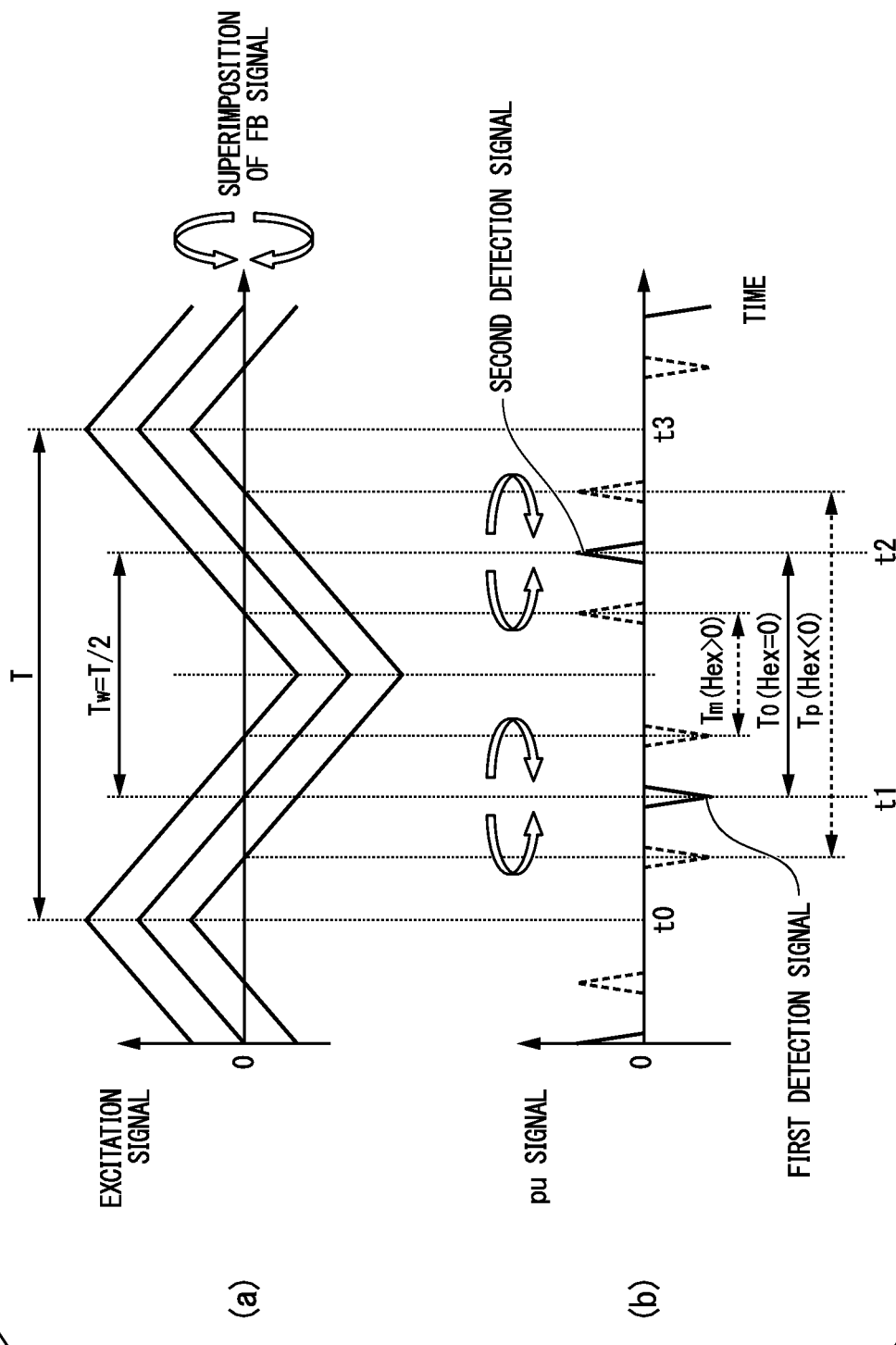
FIG. 4 is a waveform diagram showing an operation principle of the flux-gate type magnetic element.

FIG. 4 is a graph showing an operation principle of a flux-gate type magnetic element. Here, PART (a) of FIG. 4 is a graph showing the time change of a triangular wave current signal supplied to the exciting coil 52, in which the vertical axis thereof represents a current value (triangular wave current signal), and the horizontal axis thereof represents time. In PART (a) of FIG. 4, the triangular wave current signal supplied to the exciting coil 52 is a positive and negative alternating signal bordered by 0 A. In addition, the cycle of an excitation signal is T, and the interval of change in a direction in which a current flows when a magnetic field is not applied to the magnetic element 50, that is, the time width of an interval in which a first detection signal and a second detection signal are detected is T/2. PART (b) of FIG. 4 is a graph showing the time change of detection signals (first detection signal at time t1 and second detection signal at time t2) generated in the detection coil 51 due to an induced electromotive force when the direction of a current flowing to the exciting coil 52 based on the triangular wave current signal of PART (a) of FIG. 4, that is, the (positive or negative) polarity of a current changes, in which the vertical axis thereof represents voltage, and the horizontal axis thereof represents time. In this case, the reference voltage of PART (b) of FIG. 4 is set to 0 V.

Here, PART (a) of FIG. 4 shows that by the stationary magnetic field (Hex) being applied to the magnetic element 50, the current value of the triangular wave current signal applied to the exciting coil 52 deviates from 0 A of a DC current that generates an applied stationary magnetic field. In addition, it is shown that the value corresponds to deviation from 0 A of the triangular wave current signal due to the stationary magnetic field (Hex), and the generation timings of the first detection signal (time t1) and the second detection signal (time t2) deviate temporally.

Here, as can be understood from PART (b) of FIG. 4, when a difference Td between a time width Tw (=T0) between time t1 of the first detection signal and time t2 of the second detection signal (between detection signals) and a time T/2 which is ½ of the cycle T of the triangular wave is 0, the stationary magnetic field (Hex) is not applied to the magnetic element 50. In addition, a negative stationary magnetic field (Hex<0) is applied when the difference Td is positive (when Tw is Tp), and a positive stationary magnetic field (Hex>0) is applied when the difference Td is negative (when Tw is Tm).

Referring back to FIG. 1, the detection signal amplification unit 1011 amplifies a voltage between both ends of the detection coil 51 of the magnetic element 50, depending on an amplification degree which is set in advance.

The detection signal comparison unit 1012 compares a voltage value of the amplified detection signal which is supplied from the detection signal amplification unit 1011 with a threshold voltage value which is set in advance, and detects the first detection signal and the second detection signal (see PART (b) of FIG. 4).

As shown in FIG. 4, the first detection signal is a pulse having a negative polarity (negative voltage), and is generated by an induced electromotive force in a voltage region in which the polarity of a current applied to the exciting coil 52 changes from positive (positive current) to negative (negative current). On the other hand, the second detection signal is a pulse having a positive polarity (positive voltage), and is generated by an induced electromotive force in a current region in which the polarity of a current applied to the exciting coil 52 changes from negative (negative current) to positive (positive current).

The feedback signal conversion unit 1014 generates voltage information (information for determining the voltage of a feedback signal described later) corresponding to the difference Td detected by the detection signal comparison unit 1012, and outputs the generated information, as measurement data, to the feedback signal adjustment unit 1013.

The feedback signal adjustment unit 1013 generates a voltage corresponding to the voltage information which is supplied from the feedback signal conversion unit 1014, and supplies the voltage, as a feedback signal, to the excitation signal adjustment unit 1016 and the data signal conversion unit 1015.

The data signal conversion unit 1015 amplifies the voltage (feedback signal) which is supplied from the feedback signal adjustment unit 1013, depending on an amplification degree which is set in advance, and outputs the amplified voltage to the data signal determination unit 104.

In the present embodiment, even when any of a configuration in which digital processing based on an arithmetic operation using a digital value is performed and a configuration in which analog processing based on an arithmetic operation using an analog value is performed is used as a configuration in which the voltage of the feedback signal which is an FB signal is generated, the magnetic element control device 100 can be formed. Hereinafter, a configuration in which the voltage of the feedback signal is generated using digital processing and a configuration in which the feedback voltage is generated using analog processing will be described in order.

Configuration in which Voltage of Feedback Signal is Generated Using Digital Processing The detection signal comparison unit 1012 measures a time width from the first detection signal to the second detection signal, obtains a difference Td (=Tw−(T/2)) between a time width Tw (Tp, Tm or the like) and a time of a half of the cycle T of the triangular wave, that is, T/2, and outputs the resultant to the feedback signal conversion unit 1014.

When the difference Td which is time information is supplied from the detection signal comparison unit 1012, the feedback signal conversion unit 1014 generates voltage information for generating the voltage of the feedback signal as an FB signal from the difference Td.

Here, a time-voltage information table indicating the correspondence of the difference Td to voltage information of a digital value corresponding to the difference Td is previously written and stored in an internal storage unit of the feedback signal conversion unit 1014.

The feedback signal conversion unit 1014 reads out voltage information corresponding to the supplied difference Td from the time-voltage information table which is stored in the internal storage unit, and outputs the resultant to the feedback signal adjustment unit 1013. For example, the voltage information is data of a digital value indicating the voltage value of the feedback signal. In addition, the voltage information is given the polarity of the difference Td, that is, has a positive polarity when the difference Td is positive, and has a negative polarity when the difference Td is negative. Therefore, when the stationary magnetic field Hex having a positive polarity is applied to the magnetic element 50, the excitation signal adjustment unit 1016 superimposes the feedback current If having a negative polarity, as a feedback signal, on the drive current I which is generated from the triangular wave voltage signal. On the other hand, when the stationary magnetic field Hex having a negative polarity is applied thereto, the excitation signal adjustment unit superimposes the feedback current If having a positive polarity, as a feedback signal, on the drive current I which is generated from the triangular wave voltage signal.

The feedback signal adjustment unit 1013 generates a feedback signal of a voltage value indicating the voltage information on the basis of the voltage information which is supplied from the feedback signal conversion unit 1014, and outputs the generated signal, as an FB signal, to the excitation signal adjustment unit 1016.

Here, since the voltage information is a digital value, the feedback signal adjustment unit 1013 includes, for example, a D/A converter therein, inputs the voltage information which is a supplied digital value to the D/A converter to thereby obtain a direct-current voltage, and outputs the resultant, as a feedback signal, to the excitation signal adjustment unit 1016.

The excitation signal adjustment unit 1016 superimposes the feedback current If generated from the feedback signal which is an FB signal supplied from the feedback signal adjustment unit 1013 and the offset current Ia supplied from the adjustment signal generation unit 1100, on the drive current I generated therein from the triangular wave voltage signal, and applies the resultant, as the triangular wave current signal, to the exciting coil 52.

In addition, when the feedback current If is superimposed on the triangular wave current signal (excitation current), a time interval between the first detection signal and the second detection signal which are detected by the detection signal comparison unit 1012 is located in the vicinity of T/2.

For this reason, when the detection signal comparison unit 1012 has already superimposed the feedback current If on the triangular wave current signal, the output time information shows a current value of a difference between the feedback current If required for being set to T/2 and the feedback current If which is presently applied. Therefore, when an excitation signal is applied, the detection signal comparison unit 1012 outputs the difference Td, as the time information indicating the above-mentioned current value of the difference, to the feedback signal conversion unit 1014.

When the difference Td which is the time information indicating the current value of the difference is supplied, as previously stated, the feedback signal conversion unit 1014 reads out the voltage information for generating the current value corresponding to the difference Td from the time-voltage information table which is stored in the internal storage unit, and outputs the resultant to the feedback signal adjustment unit 1013.

The feedback signal adjustment unit 1013 includes a storage unit therein, integrates and stores voltage information in the storage unit, generates a voltage of the feedback signal, output to the excitation signal adjustment unit 1016, using the integrated voltage information, and outputs the generated voltage to the excitation signal adjustment unit 1016.

Here, the feedback signal adjustment unit 1013 determines whether the voltage information corresponding to the difference Td is included in a set voltage range which is set in advance.

When the voltage information is not included in the set voltage range and a stationary magnetic field which is applied to the magnetic element 50 is canceled, the feedback signal adjustment unit 1013 determines the information as a voltage of which the magnetic field does not change even by the application, that is, which has no influence on the cancellation.

That is, the feedback signal adjustment unit 1013 determines that the time width between the first detection signal and the second detection signal is substantially T/2 due to an error of control accuracy when changing a magnetic field intensity. In this case, the feedback signal adjustment unit 1013 discards voltage information falling within an error range without integrating the voltage information in the time information until just before the internal storage unit.

The data signal conversion unit 1015 amplifies the voltage information which is supplied from the feedback signal adjustment unit 1013, depending on an amplification degree which is set in advance, and outputs the resultant to the outside.

The amplification degree in the data signal conversion unit 1015 is set to a value by which only a range of the voltage value of the feedback signal in a range capable of being linearly measured in advance is output as a data signal. That is, only a range, in which a magnetic field that cancels out a stationary magnetic field and a feedback signal having a voltage value that generates the magnetic field maintain linearity, corresponds to an amplified voltage, and according to the amplification degree, a voltage falling outside of the range is saturated and is set to be a constant voltage. That is, the data signal conversion unit 1015 amplifies and outputs a feedback signal based on an amplification factor, which is set in advance, in order to saturate the voltage of a feedback signal falling outside of a voltage range of the feedback signal in which the voltage value of the feedback signal and the magnetic field intensity generated by the voltage value have linearity.

Therefore, the data signal indicates a magnetic field voltage for obtaining the intensity of a magnetic field that cancels out a stationary magnetic field, that is, the intensity of a stationary magnetic field. A magnetic field intensity determination device (not shown) located at the outside converts the voltage value of the magnetic field voltage indicated by the data signal into the intensity of a magnetic field, and outputs the converted intensity of a magnetic field.

Here, a magnetic field intensity table indicating the voltage value of the magnetic field voltage corresponding to the intensity of the magnetic field corresponding to the voltage value of the magnetic field voltage is previously written and stored in an internal storage unit of the magnetic field intensity determination device.

The magnetic field intensity determination device reads the magnetic field intensity corresponding to the voltage value of the magnetic field voltage indicating the data signal, supplied from the magnetic element control device 100, from the magnetic field intensity table, and displays the resultant, as a numerical value of the intensity of the stationary magnetic field (Hex), for example, on a display unit provided in the magnetic field intensity determination device. In the present embodiment, the magnetic detection device is constituted by the magnetic element control device 100 and the above-mentioned magnetic field intensity determination device (not shown).

Configuration in which Feedback Signal Voltage is Generated Using Analog Processing The detection signal comparison unit 1012 outputs the first detection signal and the second detection signal to the feedback signal conversion unit 1014.

The feedback signal conversion unit 1014 generates a pulse having a duty ratio as voltage information on the basis of a cycle (interval between time t1 and time t2, that is, time width) in which the first detection signal and the second detection signal are output, and outputs the pulse as voltage information to the feedback signal adjustment unit 1013.

That is, the feedback signal conversion unit 1014 obtains a duty ratio indicating the voltage value of the feedback signal, as the voltage information, from the above-mentioned time width, and outputs a square wave of the duty ratio indicating the voltage value of the feedback signal to the feedback signal adjustment unit 1013.

When the information is indicated by a square wave signal, the feedback signal adjustment unit 1013 generates a direct-current voltage corresponding to the duty ratio using a PWM (Pulse Width Modulation) circuit or the like, and outputs the generated voltage as a feedback signal.

For example, when the time width from the first detection signal to the second detection signal is longer than the time width from the second detection signal to the first detection signal, a stationary magnetic field is required to be negative. For this reason, the feedback signal adjustment unit 1013 generates a feedback signal of a direct-current voltage for generating a positive magnetic field by which the stationary magnetic field is canceled.

On the other hand, when the time width from the second detection signal to the first detection signal is longer than the time width from the first detection signal to the second detection signal, the stationary magnetic field is positive, and thus the feedback signal adjustment unit 1013 generates a feedback signal of a direct-current voltage that generates a negative magnetic field by which the stationary magnetic field is canceled.

That is, when a pulse which is voltage information is supplied, the feedback signal adjustment unit 1013 generates a feedback signal of a voltage value corresponding to the duty ratio of the pulse, and outputs the generate feedback signal to the excitation signal adjustment unit 1016.

Here, as described previously, the feedback signal adjustment unit 1013 is provided with a voltage-to-current conversion circuit which is configured using the differential amplifier 2001 and the resistors 2002 and 2003 shown in FIG. 2. In this voltage-to-current conversion circuit, the differential amplifier 2001 outputs the triangular wave current signal from the output terminal to the exciting coil 52 so that a potential difference between the voltage (reference voltage Vref) of the (+) terminal and the voltage of the (−) terminal is maintained to be zero.

For this reason, the feedback current If which is supplied to the (+) terminal of the differential amplifier 2001 has a proportional relation to an external magnetic field. The feedback current If corresponding to the feedback signal is superimposed on the drive current I, and the superimposed current is applied to the exciting coil 52. Thereby, a magnetic field based on the feedback current If is generated, and a magnetic field which is applied to a magnetic substance core within the magnetic element 50 is adjusted so as to be constant (so that the time width between the first detection signal and the second detection signal is constant at T/2). As a result, it is possible to hold the time interval between the first detection signal and the second detection signal constant without depending on an external stationary magnetic field.

Similarly to the case of digital processing, the excitation signal adjustment unit 1016 superimposes the feedback signal supplied from the feedback signal adjustment unit 1013 on the triangular wave voltage signal generated in the inside of the control circuit, and applies the triangular wave voltage signal on which the feedback signal is superimposed, as an excitation signal, to the exciting coil 52.

The operations of the data signal conversion unit 1015 are the same as those in the digital processing except for the amplification of an analog value, and thus the description thereof will not be given.

In addition, the external magnetic field intensity determination device converts a data signal of an analog value which is supplied from the magnetic element control device 100 into a digital value through A/D (Analog/Digital) conversion, and obtains a magnetic field intensity similarly to the operation described in the digital processing.

Figure 5:
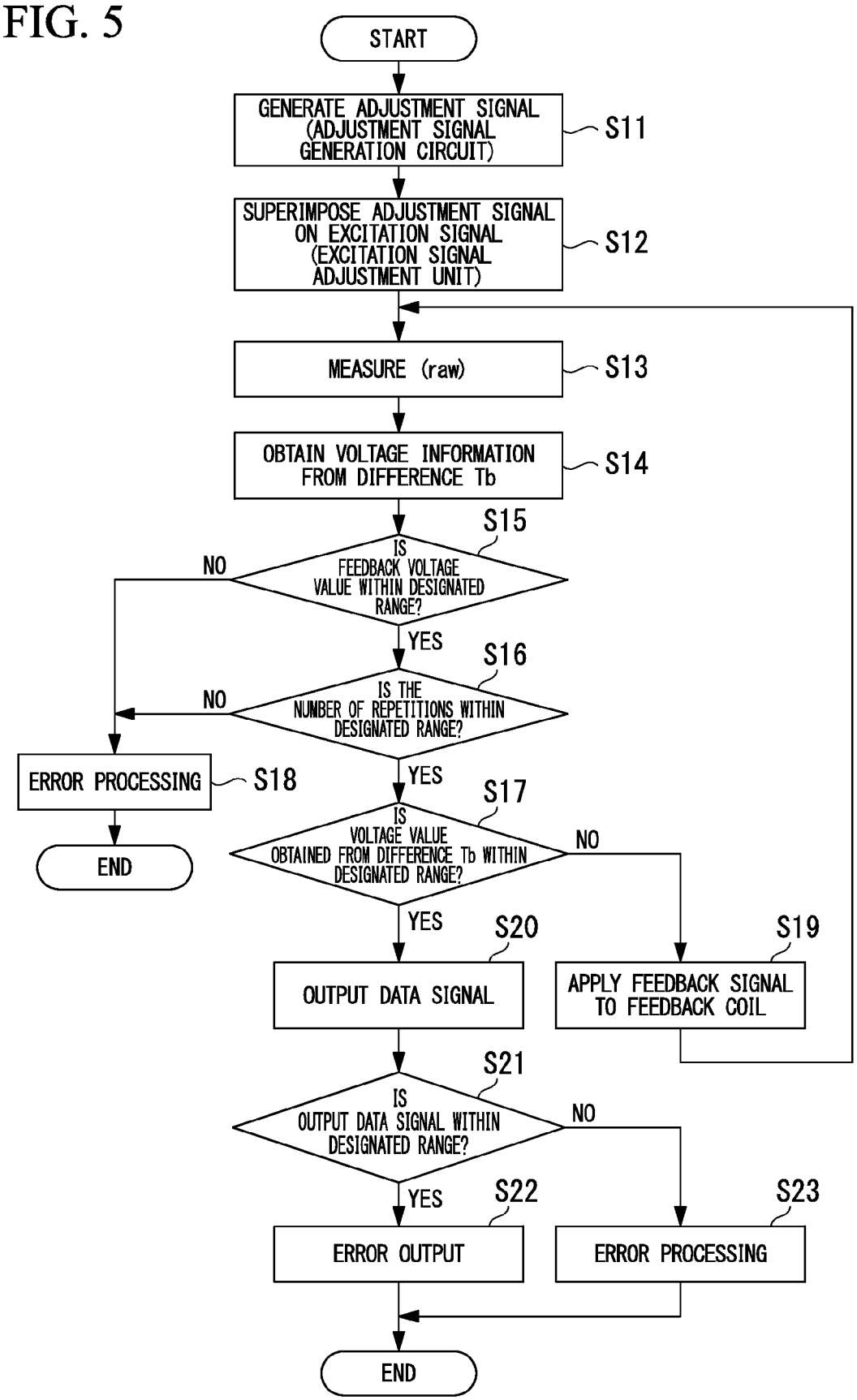
FIG. 5 is a flow diagram showing an operation example of magnetic element control processing (generation processing of a feedback voltage based on a digital value) performed by the magnetic element control device 100 according to the first embodiment.

Next, magnetic element control processing of the magnetic element control device 130 according to the first embodiment will be described with reference to FIGS. 1, 2 and 5. FIG. 5 is a flow diagram showing an operation example of magnetic element control processing (generation processing of a feedback voltage based on a digital value) performed by the magnetic element control device 130 according to the first embodiment.

Step S11:

A user encases the magnetic detection device of the present embodiment in a magnetic shielding box, and obtains the offset voltage Va that cancels an offset superimposed on a data signal and the resistance value Ra of the variable resistor 1101 (in this case, a user measures the offset voltage Va and the resistance value Ra when the data signal which is output from the magnetic detection device indicates a magnetic field of "0", in the environment of a magnetic field of "0" and room temperature).

A user controls the resistance value Ra of the variable resistor 1101, and gives the offset voltage Va from an external power supply (not shown) through the adjustment voltage input terminal to the adjustment signal generation unit 1100.

Thereby, the adjustment signal generation unit 1100 converts the offset voltage Va into the offset current Ia through the variable resistor 1101.

Step S12:

The adjustment signal generation unit 1100 supplies the generated offset current Ia to the (−) terminal of the differential amplifier 2001.

The excitation signal adjustment unit 1016 adds the drive current I (current obtained by performing voltage-current conversion on the triangular wave voltage signal through the resistor 2002), the offset current Ia (current that cancels an offset which is supplied from the adjustment signal generation unit 1100), and the feedback current If (current obtained by performing voltage-current conversion on the feedback voltage through the resistor 2003) to obtain a signal, and applies the obtained signal to the exciting coil 52, as the triangular wave current signal which is an excitation current. That is, a periodic triangular wave current which is an excitation current obtained by superimposing the offset current Ia and the feedback current If on the drive current I flows to the exciting coil 52.

Step S13:

The detection signal amplification unit 1011 amplifies a voltage between both ends of the detection coil 51, and outputs the amplified voltage to the detection signal comparison unit 1012.

The detection signal comparison unit 1012 subtracts T/2 which is a reference time width from the time width Tw between time t1 when the first detection signal is detected and time t2 when the second detection signal is detected, and outputs the difference Td of the subtraction result, as measured time information, to the feedback signal conversion unit 1014.

Thereby, the feedback signal conversion unit 1014 obtains a voltage value corresponding to the difference Td from the difference Td which is supplied from the detection signal comparison unit 1012, and outputs the obtained voltage value, as voltage information, to the feedback signal adjustment unit 1013.

Step S14:

Next, the feedback signal conversion unit 1014 obtains a voltage value corresponding to the difference Td from the difference Td which is supplied from the detection signal comparison unit 1012, and outputs the voltage value, as voltage information, to the feedback signal adjustment unit 1013.

When the voltage information is supplied, the feedback signal adjustment unit 1013 adds a voltage value indicating the voltage information to the voltage value of the immediately preceding feedback voltage which is written in an internal storage unit to obtain a voltage value, and sets the obtained voltage value as the voltage value of a new feedback voltage.

Step S15:

The feedback signal adjustment unit 1013 determines whether the obtained voltage value as the voltage value of a new feedback voltage is equal to or lower than a maximum voltage (within a designated range) which is set in advance.

The maximum voltage is set so that the generated feedback current If has a current value for which the excitation current applied to the exciting coil 52 becomes less than the saturation current of the exciting coil 52. That is, the excitation current which is the current obtained by adding the feedback current If and the peak current of the excitation current I is a current threshold range (range of a voltage value having a polarity of − to +) specifying the range of a current which does not exceed the saturation current of the exciting coil 52. For this reason, the feedback voltage range of the feedback voltage is set to the range of voltage values having a current value for which the feedback current If does not exceed a saturation current in the peak value of the drive current I, such as, for example, in a current flowing to the exciting coil 52 when the feedback voltage range of the feedback voltage is applied.

In this case, when the feedback voltage is included in the above feedback voltage range, the process of the feedback signal adjustment unit 1013 proceeds to step S16. When the feedback voltage is not included in this feedback voltage range, the process proceeds to step S18.

In addition, when it is determined that the feedback voltage is included in the feedback voltage range, the feedback signal adjustment unit 1013 performs count processing of a counter provided therein, that is, increases a count value (adds 1 to a count value).

Step S16:

Next, the feedback signal adjustment unit 1013 determines whether the count value of the counter provided therein is less than a count threshold which is previously written and stored (set in the internal storage unit) in the internal storage unit.

In this case, when the count value of the counter is less than the count threshold, the process of the feedback signal adjustment unit 1013 proceeds to step S17. On the other hand, when the count value is equal to or greater than the count threshold, the process proceeds to step S18.

The above count threshold is a value which is set in consideration of a case of no convergence when the feedback voltage is obtained. Therefore, based on the count threshold, obtained is the number of repetitions of the calculation of the feedback voltage which is capable of measuring the magnetic field intensity of the stationary magnetic field within an error range by applying the constant stationary magnetic field to the magnetic element 50, that is, capable of calculating the feedback voltage which cancels out the stationary magnetic field. A numerical value obtained by multiplying, for example, the number of repetitions by any multiple (any integer value such as 2, 3 or 4) on the basis of the number of repetitions is set to the count threshold, and the feedback signal adjustment unit 1013 writes and stores the resultant in a storage unit provided therein.

Step S17:

Next, the feedback signal adjustment unit 1013 determines whether the absolute value of the voltage value of the voltage information obtained from the difference Td is less than a voltage threshold which is set in advance.

In this case, when the voltage value of the voltage information obtained from the difference Td exceeds the voltage threshold or higher, the process of the feedback signal adjustment unit 1013 proceeds to step S19. On the other hand, when the voltage value of the voltage information is within the voltage threshold (or lower), the process proceeds to step S20.

Here, even when the voltage threshold is added to a present feedback voltage, it is determined whether the voltage threshold is a voltage value that changes a magnetic field intensity exceeding a measurement error. Therefore, the feedback signal adjustment unit 1013 determines a voltage value of less than the voltage threshold to be a voltage value that changes only a magnetic field intensity within an error in the measurement, and does not perform processing of adding the voltage value indicating the voltage information to the feedback voltage integrated in an internal storage unit. In addition, the voltage threshold is obtained by experiment or the like, and is previously written and stored in an internal storage unit of the feedback signal adjustment unit 1013.

Step S18:

The feedback signal adjustment unit 1013 disables the stationary magnetic field which is presently applied to the magnetic element 50 from being measured, and outputs an error signal to the external magnetic field intensity determination device through the data signal determination unit 104.

By the error signal being supplied, the magnetic field intensity determination device causes its own display unit to display a notification indicating that the stationary magnetic field which is presently applied to the magnetic element 50 is disabled from being measured.

Step S19:

Next, the feedback signal adjustment unit 1013 writes and stores a newly obtained feedback voltage in an internal storage unit, as an immediately preceding feedback voltage.

In addition, the feedback signal adjustment unit 1013 generates a voltage corresponding to the voltage value of the newly obtained feedback voltage, and outputs the generated voltage, as an FB signal (feedback signal), to the excitation signal adjustment unit 1016. In this case, when the voltage value of the feedback voltage is not obtained, the feedback signal adjustment unit 1013 continuously outputs the voltage value of an immediately preceding feedback voltage to the excitation signal adjustment unit 1016.

Next, the excitation signal adjustment unit 1016 generates a triangular wave voltage signal from a triangular wave which is supplied from the excitation signal generation unit 1017.

The excitation signal adjustment unit 1016 generates the drive current I from the generated triangular wave voltage signal, adds the feedback current If based on the feedback voltage supplied from the feedback signal adjustment unit 1013 and the offset current Ia generated from the adjustment signal generation unit 1100, generates a triangular wave current signal which is an excitation signal, and applies the generated signal to the exciting coil 52. Thereafter, the process of the excitation signal adjustment unit 1016 returns to step S13.

Step S20:

Next, the feedback signal adjustment unit 1013 reads out the voltage value of the feedback voltage which is stored in the internal storage unit, and outputs the read-out voltage value to the data signal conversion unit 1015.

The data signal conversion unit 1015 amplifies the voltage value of the feedback voltage supplied from the feedback signal adjustment unit 1013 based on an amplification factor which is set in advance, and outputs the amplified voltage value, as a data signal, to the data signal determination unit.

Step S21:

The data signal determination unit 104 determines whether the voltage value indicating the data signal which is supplied from the data signal conversion unit 1015 is included in the data range which is stored in the internal storage unit. In this case, when the voltage value indicating the data signal is included in the data range, the process of the data signal determination unit 104 proceeds to step S22. On the other hand, when the voltage value indicating the data signal is not included in the data range, the process of the data signal determination unit 104 proceeds to step S23.

Step S22:

The data signal determination unit 104 outputs the data signal which is supplied from the data signal conversion unit 1015, to the external magnetic field intensity determination device.

As previously stated, the magnetic field intensity determination device reads out a magnetic field intensity corresponding to the voltage value indicating of the data signal which is supplied from the magnetic element control device 130, from the magnetic field intensity table which is stored in the internal storage unit, and cases a display unit to display the resultant to the magnetic field intensity determination device.

Step S23:

Next, the data signal determination unit 104 discards the data signal supplied from the data signal conversion unit 1015, and outputs an error signal to the external magnetic field intensity determination device.

As previously stated, when the error signal is supplied from the magnetic element control device 130, the magnetic field intensity determination device causes a display unit of the magnetic field intensity determination device to display a notification indicating that the applied stationary magnetic field is disabled from being measured.

Figure 6:
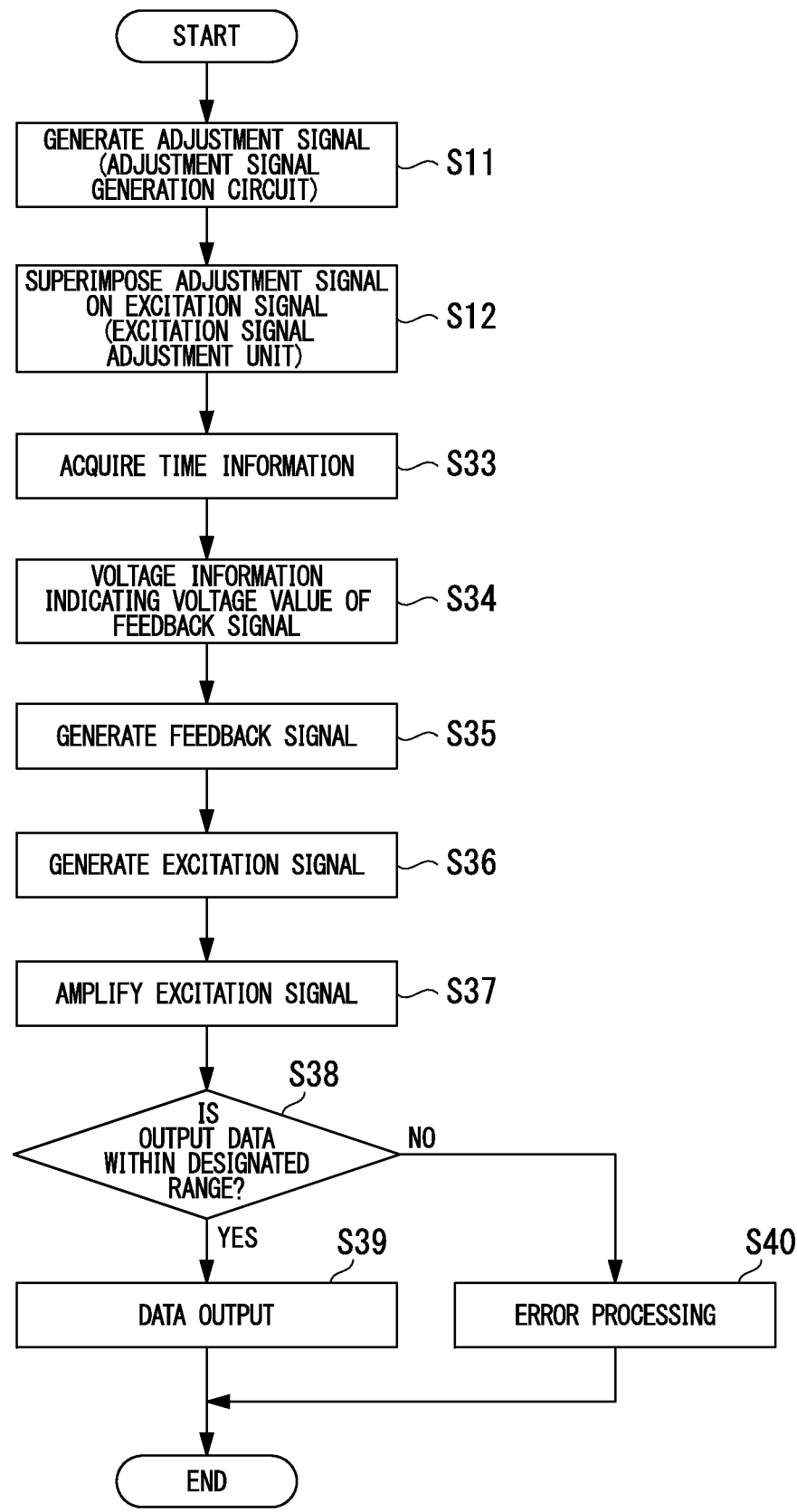
FIG. 6 is a flow diagram showing an operation example of magnetic element control processing (generation processing of a feedback voltage based on an analog value) performed by the magnetic element control device 100 according to the first embodiment.

Next, another magnetic element control processing of the magnetic element control device 130 according to the first embodiment will be described with reference to FIGS. 1, 2 and 6. FIG. 6 is a flow diagram showing an operation example of magnetic element control processing (generation processing of a feedback voltage based on an analog value) performed by the magnetic element control device 130 according to the first embodiment. Steps S11 and S12 of FIG. 6 are the same as steps S11 and S12 of FIG. 5, respectively.

Step S11:

A user encases the magnetic detection device of the present embodiment in a magnetic shielding box, and obtains the offset voltage Va for canceling an offset superimposed on a data signal and the resistance value Ra of the variable resistor 1101.

A user controls the resistance value Ra of the variable resistor 1101, and gives the offset voltage Va from a power supply (not shown) through the adjustment voltage input terminal to the adjustment signal generation unit 1100.

Thereby, the adjustment signal generation unit 1100 converts the offset voltage Va into the offset current Ia through the variable resistor 1101.

Step S12:

The adjustment signal generation unit 1100 supplies the generated offset current Ia to the (−) terminal of the differential amplifier 2001.

The excitation signal adjustment unit 1016 adds the drive current I (current generated from a triangular wave voltage signal), the offset current Ia and the feedback current If to obtain a current, and applies the obtained current to the exciting coil 52, as the triangular wave current signal which is a drive current. That is, a periodic triangular wave current flows to the exciting coil 52.

Step S33:

The detection signal amplification unit 1011 amplifies a voltage between both ends of the detection coil 51, and outputs the amplified voltage to the detection signal comparison unit 1012.

The detection signal comparison unit 1012 outputs the first detection signal and the second detection signal which are detected, as time information, to the feedback signal conversion unit 1014.

Step S34:

When the detection signal is supplied, the feedback signal conversion unit 1014 generates a train of pulses (hereinafter, referred to as a pulse train) having a duty ratio as voltage information, on the basis of a time width (time information) indicating a time interval at which the first detection signal and the second detection signal are output, and outputs the pulse train having a duty ratio, as voltage information, to the feedback signal adjustment unit 1013.

Step S35:

The feedback signal adjustment unit 1013 generates a direct-current voltage (feedback voltage) using a PWM circuit or the like, through the supplied pulse train having a duty ratio, and outputs the generated voltage, as a feedback signal, to the excitation signal adjustment unit 1016 and the data signal conversion unit 1015.

That is, when a pulse which is voltage information is supplied, the feedback signal adjustment unit 1013 generates a feedback signal of a voltage value corresponding to the duty ratio of the pulse, and outputs the generated feedback signal to the excitation signal adjustment unit 1016 and the data signal conversion unit 1015.

Here, the feedback signal adjustment unit 1013 is provided with a voltage-to-current conversion circuit which is configured using, for example, an operational amplifier. In the voltage-to-current conversion circuit, since an amplifier having an operational amplifier function is used, and the amplifier functions so that a potential difference between a positive input and a negative input is maintained to be zero, a current signal from the output of the amplifier to the positive input thereof has a proportional relation to an external magnetic field. By applying a signal proportional to the current signal, as a feedback signal, to the exciting coil 52, a magnetic field based on the feedback signal is generated, and a magnetic field which is applied to a magnetic substance core within the magnetic element 50 is adjusted so as to become constant. As a result, it is possible to hold the time interval between the first detection signal and the second detection signal constant without depending on an external stationary magnetic field.

Step S36:

The excitation signal adjustment unit 1016 adds the feedback current If obtained by performing voltage-current conversion on the feedback voltage from the feedback signal adjustment unit 1013, the drive current I by performing voltage-current conversion on the triangular wave voltage signal from the excitation signal generation unit 1017, and the offset current Ia which is supplied from the adjustment signal generation unit 1100, and generates an excitation signal which is a triangular wave current signal to apply the generated signal to the exciting coil 52.

Step S37:

The data signal conversion unit 1015 amplifies the voltage value of the feedback signal supplied from the feedback signal adjustment unit 1013 based on an amplification factor which is set in advance, and outputs the amplified voltage value, as a data signal, to the data signal determination unit 104.

Step S38:

The data signal determination unit 104 determines whether the voltage value indicating of the data signal which is supplied from the data signal conversion unit 1015 is included in the data range specified by two threshold voltages which are set in an internal determination circuit. In this case, when the voltage value indicating the data signal is included in the data range, the process of the data signal determination unit 104 proceeds to step S39. On the other hand, when the voltage value indicating the data signal is not included in the data range, the process of the data signal determination unit 104 proceeds to step S40.

Step S39:

The data signal determination unit 104 outputs the data signal which is supplied from the data signal conversion unit 1015, to the external magnetic field intensity determination device.

As previously stated, the magnetic field intensity determination device converts the voltage of a data signal into a digital value through A/D conversion, reads out a magnetic field intensity corresponding to the voltage value indicating the data signal supplied from the magnetic element control device 130, from the magnetic field intensity table which is stored in the internal storage unit, using the converted digital value, and causes a display unit of the magnetic field intensity determination device to display the read magnetic field intensity.

Step S40:

The data signal determination unit 104 discards the data signal supplied from the data signal conversion unit 1015, and outputs an error signal to the external magnetic field intensity determination device.

As previously stated, when the error signal is supplied from the magnetic element control device 130, the magnetic field intensity determination device causes a display unit of the magnetic field intensity determination device to display a notification indicating that the applied stationary magnetic field is disabled from being measured.

With the above-mentioned configuration, according to the present embodiment, since the feedback signal is superimposed on an excitation signal, and the excitation signal is applied to the exciting coil 52, it is possible to use a magnetic element which is generally used in a magnetic proportion system, and to form a magnetic detection device having reductions in price and size as compared to a magnetic element provided with an FB coil used in the measurement of a magnetic field intensity based on a time-resolution magnetic balance system of the related art, by the combination of the magnetic element control device and the magnetic field intensity determination device.

Here, by not only reducing the size of the magnetic element, but also increasing the number of turns of the exciting coil or the detection coil using the region of the FB coil when the size of the magnetic element is the same as that in the magnetic balance system, it is possible to further widen the measurement range of the stationary magnetic field due to an increase in excitation efficiency, or to improve the S/N (Signal/Noise) ratio of the detection signal in the detection coil.

According to the present embodiment, although a magnetic element which is generally used in a magnetic proportion system is employed, it is possible to widen the intensity range of a stationary magnetic field which is applied to the magnetic element, as compared to a case where magnetism is detected by the magnetic proportion system.

According to the present embodiment, since the feedback signal is superimposed, as an FB signal, on the triangular wave voltage signal, as compared to a case where an FB signal is applied as a current to an FB coil of the related art, it is possible to stabilize a time variation in the reference voltage of a differential signal when a constant current (FB signal) is generated, and to suppress a time variation in data signal to be output.

According to the present embodiment, the offset current Ia that cancels an offset superimposed on output data of a data signal is supplied to the (−) terminal of the differential amplifier 2001 of the excitation signal adjustment unit 1016. Therefore, offset adjustment can be performed by a simple circuit, and thus it is possible to reduce the size of the circuit in order to perform an offset, to realize a reduction in the size of a circuit, and to reduce consumption current.

Further, according to the present embodiment, since the absolute values of the feedback current If and the offset current Ia are the same as each other, and both the currents are simultaneously applied in a state where the currents flow in opposite directions, an increase in current is not generated in the entirety of a control circuit. Therefore, an effect is exhibited in which the offset of an output value (output data of a data signal) can be adjusted (offset components superimposed on a data signal can be canceled) without increasing the consumption current of the entire control circuit.

According to the present embodiment, an offset superimposed on a data signal due to the manufacturing variation of a circuit element constituting the magnetic element control device 100 can be easily canceled even after the completion of the magnetic element control device by giving the offset voltage Va from the outside. Thereby, according to the present embodiment, it is possible to reduce power consumption, and to supply a highly accurate data signal.

According to the present embodiment, when the excitation signal generation unit 1017 generates a triangular wave, in order to avoid a non-linear region (hereinafter, referred to as crossover distortion) in the vicinity of a reference potential which is caused by the characteristics of an operational amplifier used in the generation, a time interval between the detection signals (first detection signal and second detection signal) can be corrected by setting the reference potential of FB control to a potential different from the reference potential of the excitation signal generation unit 1017, or the like.

For example, in order to accurately determine an FB signal of magnetic balance, an offset is given to a triangular wave voltage signal in advance, and the reference potential is adjusted so as to intersect the region of a triangular wave which does not have crossover distortion.

Second Embodiment

Figure 7:
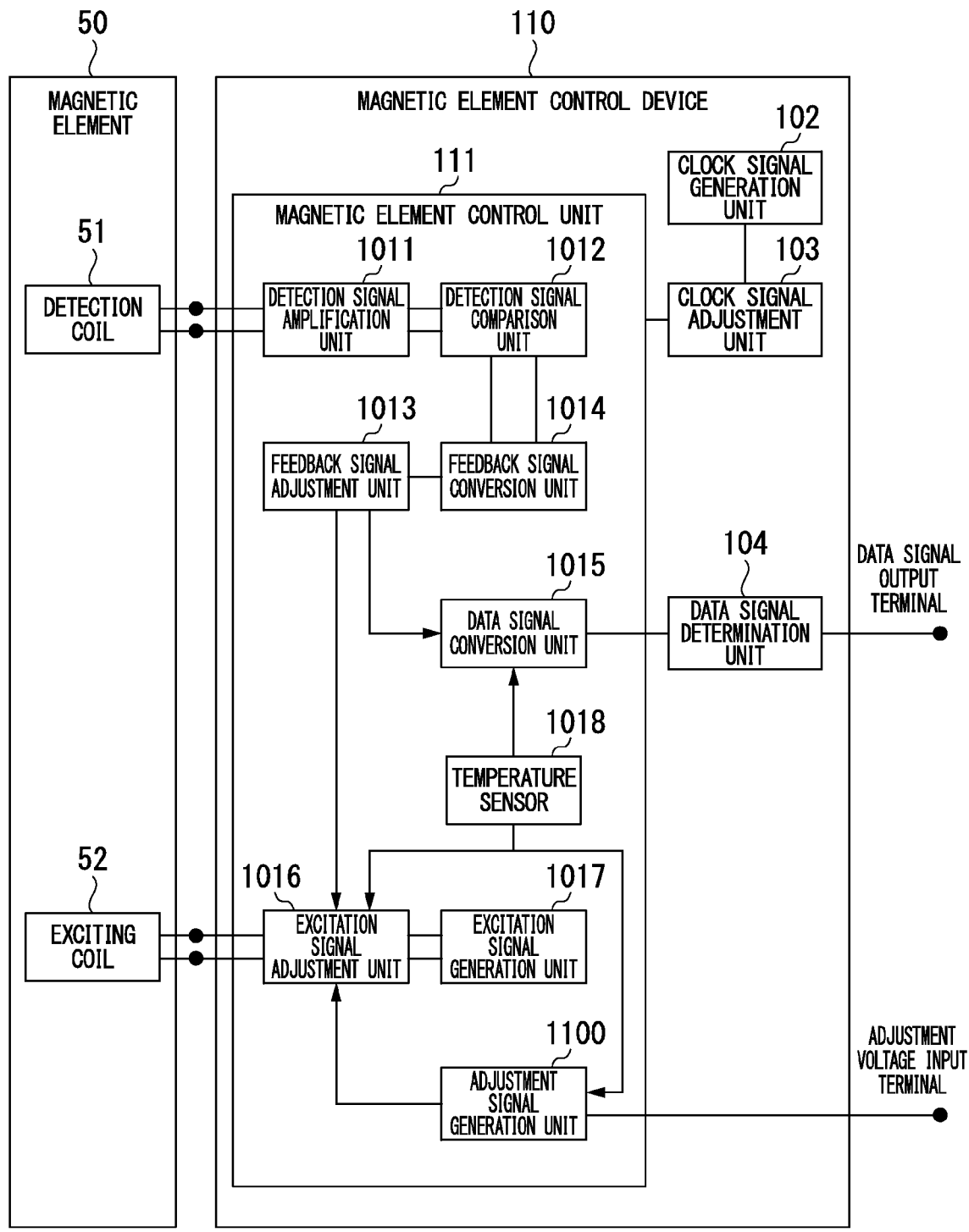
FIG. 7 is a diagram showing a configuration example of a magnetic element control device 110 according to a second embodiment of the present invention.

Next, a magnetic element control device 110 according to a second embodiment will be described with reference to FIG. 7. FIG. 7 is a diagram showing a configuration example of the magnetic element control device 110 according to the present embodiment.

The same components as those of the magnetic element control device 100 of FIG. 1 described in the first embodiment of the present invention are denoted by the same reference numerals and signs. In FIG. 7, the magnetic element control device 110 includes a magnetic element control unit 111, a clock signal generation unit 102, a clock signal adjustment unit 103, and a data signal determination unit 104. In addition, the magnetic element control unit 111 includes a detection signal amplification unit 1011, a detection signal comparison unit 1012, a feedback signal adjustment unit 1013, a feedback signal conversion unit 1014, a data signal conversion unit 1015, an excitation signal adjustment unit 1016, an excitation signal generation unit 1017, a temperature sensor 1018 and an adjustment signal generation unit 1100.

Hereinafter, components and operations different from those of the magnetic element control device 100 of FIG. 1 will be described.

The temperature sensor 1018 measures the temperature of the magnetic element 50, and outputs temperature data indicating the measured temperature to the data signal conversion unit 1015, the excitation signal adjustment unit 1016, and the adjustment signal generation unit 1100.

Thereby, a voltage information correction table indicating the correspondence of a temperature to a voltage information correction coefficient for correcting an influence due to the temperature of voltage information which is supplied from the feedback signal adjustment unit 1013 is previously written and stored in an internal storage unit of the data signal conversion unit 1015.

The data signal conversion unit 1015 reads out a voltage information correction coefficient corresponding to the temperature data which is supplied from the temperature sensor 1018, from the voltage information correction table.

The data signal conversion unit 1015 multiplies the voltage information which is supplied from the feedback signal adjustment unit 1013 by the read-out voltage information correction coefficient to generate multiplied voltage information as a data signal.

A voltage value correction table indicating the temperature corresponding to a voltage value correction coefficient for correcting an influence due to the temperature of the voltage value of an excitation signal obtained by superimposing a feedback signal on a triangular wave voltage signal is previously written and stored in an internal storage unit of the excitation signal adjustment unit 1016.

The excitation signal adjustment unit 1016 reads out the voltage value correction coefficient corresponding to the temperature data which is supplied from the temperature sensor 1018, from the voltage value correction table.

The excitation signal adjustment unit 1016 multiplies the voltage of the excitation signal, generated by the excitation signal adjustment unit 1016, by the read-out voltage value correction coefficient to apply the multiplied excitation signal to the exciting coil 52.

In addition, a cycle correction table indicating the temperature corresponding to a cycle correction coefficient for correcting an influence due to the temperature of the cycle of the excitation signal is previously written and stored in an internal storage unit of the excitation signal adjustment unit 1016.

The excitation signal adjustment unit 1016 reads out the cycle correction coefficient corresponding to the temperature data which is supplied from the temperature sensor 1018, from the cycle correction table.

The excitation signal adjustment unit 1016 corrects the cycle of a triangular wave which is supplied from the excitation signal generation unit 1017, using the read-out cycle correction coefficient, and generates a triangular wave voltage signal from the triangular wave of the correction result.

Further, the excitation signal adjustment unit 1016 may add and superimpose a feedback signal onto the triangular wave voltage signal in synchronization with a clock signal which is output by the clock signal adjustment unit 103 to obtain a signal, and may generate an excitation signal by performing D/A conversion on the obtained signal.

Here, a measurement cycle having arbitrary time width is generated in synchronization with the clock signal, a period in which measurement processing is performed by applying the excitation signal to the exciting coil 52 and a period in which measurement is not performed by stopping the application of the excitation signal to the exciting coil 52 are alternately provided, and the exciting coil 52 is intermittently operated.

Thereby, the generation of heat in the magnetic element 50 itself is suppressed, and changes in temperature are reduced, thereby allowing a magnetic field intensity to be measured with a higher degree of accuracy.

Further, exciting coils of a plurality of magnetic elements are driven in order using the function of an intermittent operation, and thus a stationary magnetic field can be measured by one magnetic element control device and a plurality of magnetic elements.

For example, magnetic elements are provides so that the respective measurement axes of three magnetic elements, that is, three axes of an x-axis, a y-axis and a z-axis are at right angles to each other. The provided magnetic elements can be used in the control of magnetic elements provided at other axes that measures the magnetic field intensity and the direction of a magnetic field in a three-dimensional space.

In addition, in the second embodiment, as described above, voltage information, offset information and the temperature compensation of an excitation signal are performed.

When the temperature compensation of an excitation signal in the excitation signal adjustment unit 1016 is not performed, the resistance value of the exciting coil 52 changes due to a change in the temperature of the exciting coil 52, the value of a current flowing due to the excitation signal fluctuates. In addition, the cycle or peak value (for example, peak value of a triangular wave voltage signal) of the excitation signal may fluctuate due to the temperature characteristics of a circuit constituting the excitation signal adjustment unit 1016.

In a case of FB control, since a change in temperature detected by temperature measurement for a single feedback time of an FB signal is sufficiently slow, there is little influence on convergence when an FB signal that cancels out a stationary magnetic field which is applied to the magnetic element 50 is generated.

However, as described above, a current (excitation current) flowing to the exciting coil 52 due to an excitation signal changes with a fluctuation in the resistance value of the exciting coil 52 associated with a change in temperature, and the magnetic sensitivity of a stationary magnetic field which is applied to the magnetic element 50 fluctuates.

In addition, voltage information which corresponds to a fluctuation in magnetic sensitivity and is obtained a time width between detection signals (first detection signal and second detection signal) which is output from the detection coil 51 can be corrected by temperature compensation in the data signal conversion unit 1015. As a result, it is possible to realize a temperature dependency of magnetic sensitivity which is the same as that of the excitation signal of current control.

However, the measured difference Td itself may fluctuate due to a change (such as, for example, an increase in the width of a signal) in the signal waveforms of the detection signals (first detection signal and second detection signal). For this reason, in order to correct the measured time width, as in the present embodiment, the temperature compensation of the cycle itself of the excitation signal is effective in suppressing a fluctuation in magnetic sensitivity.

In addition to the correction of the cycle of the excitation signal, as in the present embodiment, in the adjustment signal generation unit 1100, the correction of the variable resistor 1101 and the offset voltage Va in the adjustment signal generation unit 1100 in association with a change in temperature is also effective at compensating for the difference Td.

That is, in the environment of a zero magnetic field and room temperature, an offset superimposed on a data signal is canceled, and the resistance value Ra of the variable resistor 1101 and the voltage value of the offset voltage Va in a state where a magnetic field indicated by the data signal is set to "0" are measured. The resistance value Ra and the offset voltage Va in this case become setting values of the magnetic element control device in which the variable resistor 1101 is mounted.

In addition, the resistance value change rate (for example, per 1° C.) of the unit temperature of the resistance value Ra of the variable resistor 1101 is obtained by increasing or decreasing a temperature from room temperature. A resistance value change rate table in which the temperature and the resistance value change rate in the temperature are associated with each other is written and stored in an internal storage unit of the adjustment signal generation unit 1100. In addition, the resistance value Ra of the variable resistor 1101 and the voltage value of the offset voltage Va in a state where a magnetic field indicated by the measured data signal is set to "0" are also written and stored as reference values in the internal storage unit.

Thereby, at the time of starting up the magnetic element control device 110, the adjustment signal generation unit 1100 reads out the resistance value change rate corresponding to a temperature indicated by temperature data which is supplied from the temperature sensor 1019 and the resistance value Ra of the reference value, from the resistance value change rate table which is stored in the internal storage unit. The adjustment signal generation unit 1100 divides the read-out resistance value Ra of the reference value by the read-out resistance value change rate, and sets this division result to the resistance value Ra of the variable resistor 1101 in a present temperature. The adjustment signal generation unit 1100 adjusts the resistance value Ra of the reference value of the variable resistor 1101 to the resistance value Ra corresponding to the obtained present temperature. As a result, the resistance value Ra changed corresponding to a change in temperature can be adjusted to the resistance value Ra which is set as the reference value, and the adjustment signal generation unit 1100 can always supply the offset current Ia which is set initially to the excitation signal adjustment unit 1016, regardless of a change in temperature.

In addition, a DC/DC converter may be provided in the adjustment signal generation unit 1100, and the DC/DC converter may be configured to adjust the voltage value of the offset voltage Va which is supplied from an external power supply in response to the above resistance value change rate so that the current value of the initial value of the offset current Ia which is set initially changes regardless of the temperature.

In the second embodiment, as is the case with the first embodiment described previously, processing until the feedback signal adjustment unit 1013 may be performed by arithmetic operation processing using a digital value, that is, voltage information of a digital value indicating the voltage value of the feedback signal may be supplied, as the feedback signal, from the feedback signal adjustment unit 1013 to the excitation signal adjustment unit 1016.

In this case, the excitation signal generation unit 1017 outputs a triangular wave to the excitation signal adjustment unit 1016 using a digital value.

With such a configuration, as is the case with the first embodiment, the excitation signal adjustment unit 1016 may add and superimpose a feedback signal onto the triangular wave voltage signal in synchronization with a clock signal which is output by the clock signal adjustment unit 103 to obtain a signal, and may generate an excitation signal by performing D/A conversion on the obtained signal.

Here, a measurement cycle having any time width is generated in synchronization with the clock signal, a period in which measurement processing is performed by applying the excitation signal to the exciting coil 52 and a period in which measurement is not performed by stopping the application of the excitation signal to the exciting coil 52 are alternately provided, and the exciting coil 52 is intermittently operated.

Thereby, the generation of heat in the magnetic element 50 itself is suppressed, and changes in temperature are reduced, thereby allowing a magnetic field intensity to be measured with a higher degree of accuracy.

In addition, according to the present embodiment, an offset superimposed on a data signal due to the manufacturing variation of a circuit element constituting the magnetic element control device 100 can be easily canceled by giving the offset voltage Va from the outside. Thereby, according to the present embodiment, it is possible to supply a highly accurate data signal.

Further, as is the case with the first embodiment, exciting coils of a plurality of magnetic elements are driven in order using the function of an intermittent operation, and thus a stationary magnetic field can be measured by one magnetic element control device and a plurality of magnetic elements.

For example, magnetic elements are provides so that the respective measurement axes of three magnetic elements, that is, three axes of an x-axis, a y-axis and a z-axis are at right angles to each other. The provided magnetic elements can be used in the control of magnetic elements provided at other axes that measures the magnetic field intensity and the direction of a magnetic field in a three-dimensional space.

Third Embodiment

Figure 8:
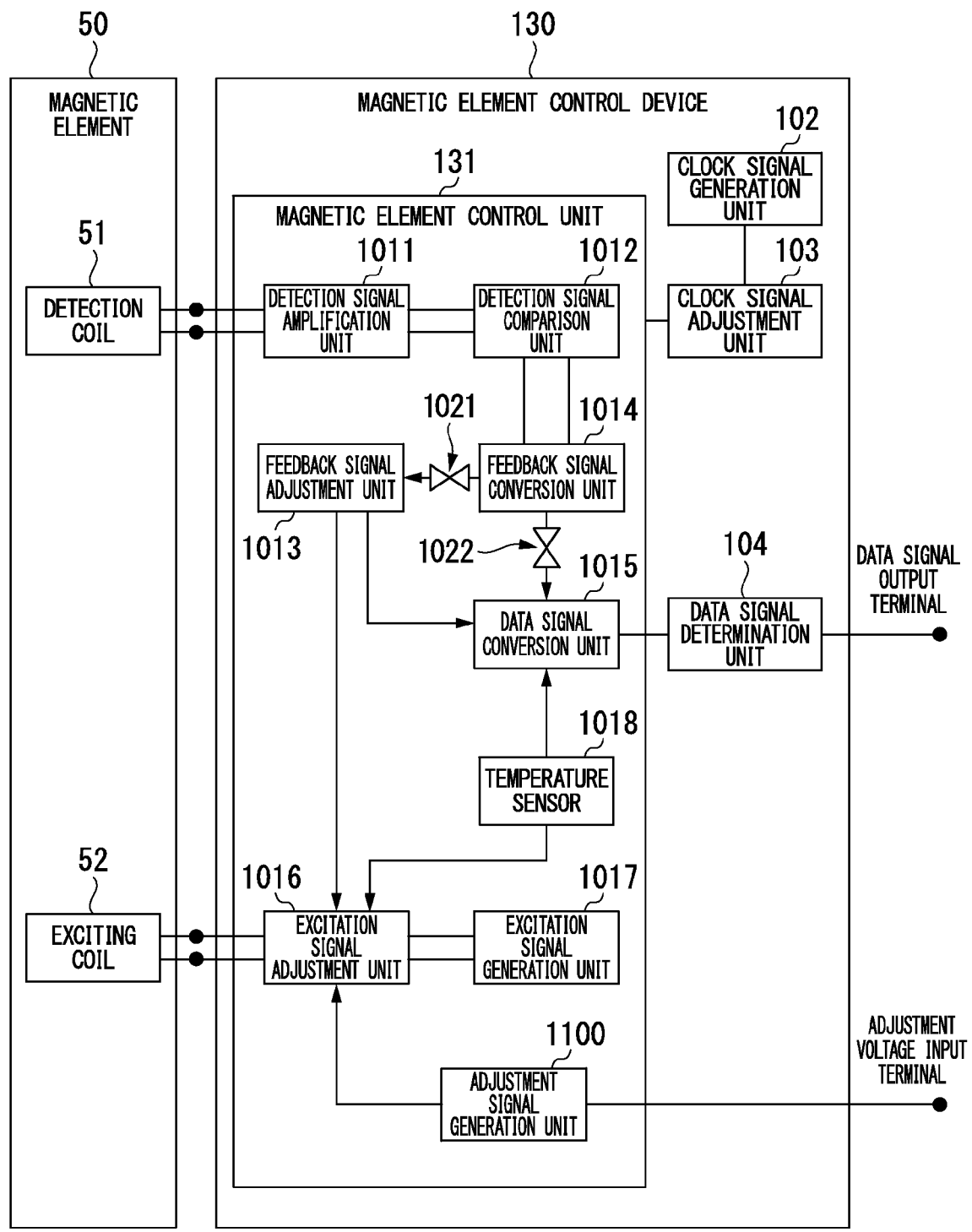
FIG. 8 is a diagram showing a configuration example of a magnetic element control device 100 according to a third embodiment.

Next, a magnetic element control device 130 according to a third embodiment will be described with reference to FIG. 8. FIG. 8 is a diagram showing a configuration example of the magnetic element control device 130 according to the present embodiment.

Components the same as those of the magnetic element control device 110 of FIG. 7 described in the second embodiment are denoted by the same reference numerals and signs. In FIG. 8, the magnetic element control device 130 includes a magnetic element control unit 131, a clock signal generation unit 102, a clock signal adjustment unit 103, and a data signal determination unit 104.

The magnetic element control unit 131 includes a detection signal amplification unit 1011, a detection signal comparison unit 1012, a feedback signal adjustment unit 1013, a feedback signal conversion unit 1014, a data signal conversion unit 1015, an excitation signal adjustment unit 1016, an excitation signal generation unit 1017, a temperature sensor 1019, a first analog switch 1021, and a second analog switch 1022.

Hereinafter, only components and operations different from those of the magnetic element control device 110 of FIG. 6 will be described.

The configuration of the third embodiment is different from that of the second embodiment, in that it can correspond to any of the magnetic field measurement of a magnetic balance type measurement device and the magnetic field measurement of a magnetic proportion type measurement device.

That is, in the third embodiment, the configuration of the magnetic field measurement of a magnetic balance type measurement device in the second embodiment can be arbitrarily selected and switched by a user to the configuration of the magnetic field measurement of a magnetic proportion type measurement device. Hereinafter, a description is given of a case in which processing of generating a feedback voltage is performed using a digital value, but the same is true of a case in which the generation of the feedback voltage is performed using analog processing.

In FIG. 8, switching is performed in which the first analog switch 1021 and the second analog switch 1022 are configured as a magnetic balance type measurement device, or configured as a magnetic proportion type measurement device.

That is, when it is detected that a changeover switch (not shown) of the magnetic element control device 130 is in a state indicating control of the magnetic balance type measurement device configuration, the magnetic element control unit 131 sets the first analog switch 1021 to be in an electrical conduction state (ON), and sets the second analog switch 1022 to be in an electrical non-conduction state (OFF).

Thereby, in the feedback signal conversion unit 1014, the difference Td indicating a time is output to the feedback signal adjustment unit 1013, and measurement processing of a magnetic field similar to that in the second embodiment is performed.

On the other hand, when it is detected that a changeover switch (not shown) of the magnetic element control device 130 is in a state indicating control of the magnetic proportion type configuration, the magnetic element control unit 131 sets the first analog switch 1021 to be in an electrical non-conduction state (OFF), and sets the second analog switch 1022 to be in an electrical conduction state (ON).

Thereby, after voltage information corresponding to the difference Td indicating a time is obtained, the feedback signal conversion unit 1014 does not output this voltage information to the feedback signal adjustment unit 1013, but outputs the information to the data signal conversion unit 1015.

When the above changeover switch is in a state indicating control of the magnetic proportion type configuration, the feedback signal conversion unit 1014 outputs a voltage value indicating a magnetic field intensity, on the basis of the difference Td which is supplied from the detection signal comparison unit 1012.

Here, a magnetic proportion type voltage table indicating the correspondence of the difference Td to the voltage value indicating a magnetic intensity corresponding to the difference Td is previously written and stored in an internal storage unit of the feedback signal conversion unit 1014.

The feedback signal conversion unit 1014 reads out the voltage value corresponding to the difference Td which is supplied from the detection signal comparison unit 1012, from the magnetic proportion type voltage table, amplifies the voltage value based on an amplification factor which is set corresponding to a case of a magnetic proportion system, and outputs the resultant to the data signal determination unit 104. Similarly to the amplification factor in the case of a magnetic proportion type system, the amplification factor in the case of a magnetic proportion type system is also set to a value serving as a limiter for extracting only a region in which the voltage value and the magnetic intensity are in a linear relation.

Therefore, in the case of the magnetic balance type configuration, the feedback signal conversion unit 1014 amplifies the voltage information which is supplied from the feedback signal adjustment unit 1013, based on an amplification factor which is set to correspond to the case of a magnetic balance system, and outputs the amplified voltage information, as the voltage value of a data signal, to the data signal determination unit 104.

In addition, similarly to the magnetic balance system, in the case of the magnetic proportion type system, the data signal determination unit 104 determines whether the linear relation which is set in advance is within a maintained range.

Figure 9:
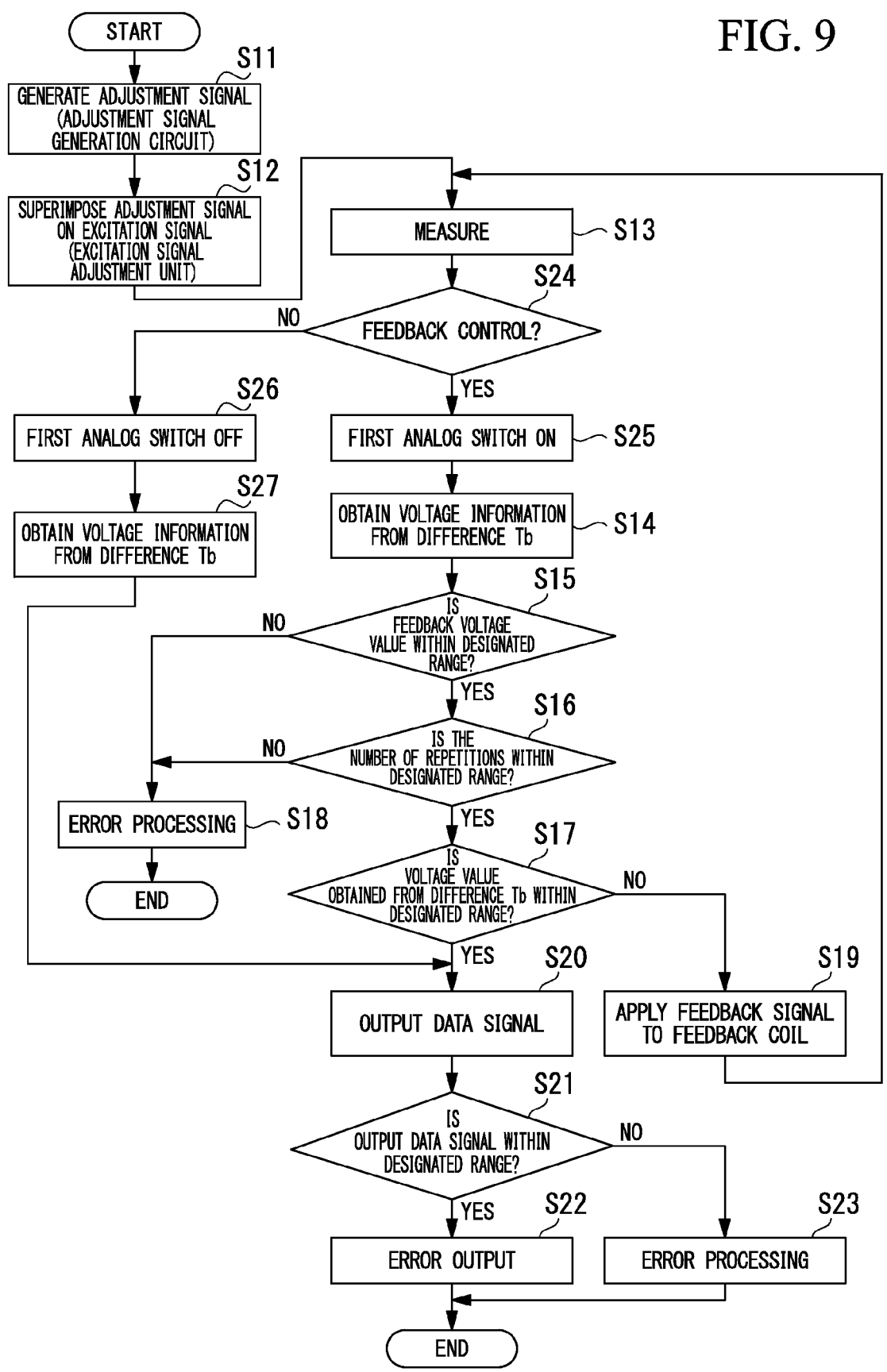
FIG. 9 is a flow diagram showing an operation example of magnetic element control processing (generation processing of a feedback voltage based on a digital value) performed by a magnetic element control device 130 according to the third embodiment.

Next, magnetic element control processing of the magnetic element control device 130 according to the third embodiment will be described with reference to FIGS. 8 and 9. FIG. 9 is a flow diagram showing an operation example of magnetic element control processing (generation processing of a feedback voltage based on a digital value) performed by the magnetic element control device 130 according to the third embodiment. Steps S11 and S12 in FIG. 9 are the same as steps S11 and S12 in FIG. 5, respectively.

Step S11:

A user encases the magnetic detection device of the present embodiment in a magnetic shielding box, and obtains the offset voltage Va for canceling an offset superimposed on a data signal and the resistance value Ra of the variable resistor 1101.

A user controls the resistance value Ra of the variable resistor 1101, and gives the offset voltage Va from an external power supply (not shown) through the adjustment voltage input terminal to the adjustment signal generation unit 1100.

Step S12:

The adjustment signal generation unit 1100 converts the offset voltage Va into the offset current Ia through the variable resistor 1101.

The adjustment signal generation unit 1100 supplies the generated offset current Ia to the (−) terminal of the differential amplifier 2001.

The excitation signal adjustment unit 1016 adds the drive current I (current obtained by performing voltage-current conversion on the triangular wave voltage signal through the resistor 2002), the offset current Ia (current that cancels an offset which is supplied from the adjustment signal generation unit 1100), and the feedback current If (current obtained by performing voltage-current conversion on the feedback voltage through the resistor 2003) to obtain a current, and applies the obtained current to the exciting coil 52, as the triangular wave current signal which is an excitation current. That is, a periodic triangular wave current which is an excitation current obtained by superimposing the offset current Ia and the feedback current If on the drive current flows to the exciting coil 52.

Step S13:

The detection signal amplification unit 1011 amplifies a voltage between both ends of the detection coil 51, and outputs the amplified voltage to the detection signal comparison unit 1012.

The detection signal comparison unit 1012 subtracts T/2 which is a reference time width from the time width Tw between time t1 when the first detection signal is detected and time t2 when the second detection signal is detected, and outputs the difference Td of the subtraction result, as measured time information, to the feedback signal conversion unit 1014.

Step S24:

The magnetic element control unit 131 detects either a state (a magnetic balance system mode) of feedback control indicating that the changeover switch uses the magnetic element control device 130 as the magnetic balance type configuration, or a state (magnetic proportion system mode) of no feedback control, indicating that the changeover switch uses the magnetic element control device 130 as the magnetic proportion type configuration.

When the changeover switch is a magnetic balance system mode, the process of the magnetic element control unit 131 proceeds to step S25. On the other hand, when the changeover switch is a magnetic proportion system mode, the process proceeds to step S26.

Step S25:

When the changeover switch is a magnetic balance mode, the magnetic element control unit 131 sets the first analog switch 1021 to be in an electrical conduction state, and sets the second analog switch 1022 to be in an electrical non-conduction state.

Thereby, the feedback signal conversion unit 1014 obtains a voltage value corresponding to the difference Td from the difference Td which is supplied from the detection signal comparison unit 1012, and outputs the obtained voltage value, as voltage information, to the feedback signal adjustment unit 1013.

Step S14:

The feedback signal conversion unit 1014 obtains a voltage value corresponding to the difference Td from the difference Td which is supplied from the detection signal comparison unit 1012, and outputs the voltage value, as voltage information, to the feedback signal adjustment unit 1013.

When the voltage information is supplied, the feedback signal adjustment unit 1013 adds a voltage value indicating the voltage information to the voltage value of the immediately preceding feedback voltage which is written in a storage unit of the feedback signal adjustment unit 1013 to obtain a voltage value, and sets the obtained voltage value as the voltage value of a new feedback voltage.

Step S15:

The feedback signal adjustment unit 1013 determines whether the voltage value of the new feedback voltage of the obtained voltage value is equal to or lower than a maximum voltage (within a designated range) which is set in advance.

The maximum voltage is set so that the generated feedback current If has a current value for which the excitation current applied to the exciting coil 52 becomes less than the saturation current of the exciting coil 52. That is, the excitation current which is the addition current of the feedback current If and the peak current of the excitation current I is a current threshold range (range of a voltage value having a polarity of − to +) for specifying the range of a current which does not exceed the saturation current of the exciting coil 52. For this reason, the feedback voltage range of the feedback voltage is set to the range of a voltage value having a current value for which the feedback current If does not exceed a saturation current in the peak value of the drive current I, for example, in a current flowing to the exciting coil 52 when applied.

In this case, when the feedback voltage is included in the feedback voltage range, the process of the feedback signal adjustment unit 1013 proceeds to step S16. When the feedback voltage is not included in the feedback voltage range, the process proceeds to step S18.

In addition, when it is determined that the feedback voltage is included in the feedback voltage range, the feedback signal adjustment unit 1013 performs count processing of a counter provided therein, that is, increases a count value (adds 1 to a count value).

Step S16:

The feedback signal adjustment unit 1013 determines whether the count value of the counter provided therein is less than a count threshold which is previously written and stored (set in the internal storage unit) in the internal storage unit.

In this case, when the count value of the counter is less than the count threshold, the process of the feedback signal adjustment unit 1013 proceeds to step S17. On the other hand, when the count value is equal to or greater than the count threshold, the process proceeds to step S18.

The above count threshold is a value which is set in consideration of a case of no convergence when the feedback voltage is obtained. Therefore, based on the count threshold, the number of repetitions of the calculation of the feedback voltage which is capable of measuring the magnetic field intensity of the stationary magnetic field within an error range by applying the constant stationary magnetic field to the magnetic element 50, that is, capable of calculating the feedback voltage which cancels out the stationary magnetic field is obtained. A numerical value obtained by multiplying, for example, the number of repetitions by any multiple (any numerical value such as 2) on the basis of the number of repetitions is set as the count threshold, and the feedback signal adjustment unit 1013 writes and stores the numeric result in a storage unit provided therein.

Step S17:

The feedback signal adjustment unit 1013 determines whether the absolute value of the voltage value of the voltage information obtained from the difference Td is less than a voltage threshold which is set in advance.

In this case, when the voltage value of the voltage information obtained from the difference Td exceeds the voltage threshold, the process of the feedback signal adjustment unit 1013 proceeds to step S19. On the other hand, when the voltage value of the voltage information is within the voltage threshold (or lower), the process proceeds to step S20.

Here, even when the voltage threshold is added to a present feedback voltage, it is determined whether the voltage threshold is a voltage value for changing a magnetic field intensity exceeding a measurement error. Therefore, the feedback signal adjustment unit 1013 determines the voltage value of less than the voltage threshold to be a voltage value for changing only a magnetic field intensity within an error in the measurement, and does not perform processing of adding the voltage value indicating the voltage information to the feedback voltage integrated in an internal storage unit. In addition, the voltage threshold is obtained by an experiment or the like, and is previously written and stored in an internal storage unit of the feedback signal adjustment unit 1013.

Step S18:

The feedback signal adjustment unit 1013 disables the stationary magnetic field which is presently applied to the magnetic element 50 from being measured, and outputs an error signal to the external magnetic field intensity determination device through the data signal determination unit 104.

By the error signal being supplied, the magnetic field intensity determination device causes a display unit of the magnetic field intensity determination device to display a notification indicating that the stationary magnetic field which is presently applied to the magnetic element 50 is disabled from being measured.

Step S19:

The feedback signal adjustment unit 1013 writes and stores a newly obtained feedback voltage in an internal storage unit, as an immediately preceding feedback voltage.

The feedback signal adjustment unit 1013 generates a voltage corresponding to the voltage value of the newly obtained feedback voltage, and outputs the generated voltage, as an FB signal (feedback signal), to the excitation signal adjustment unit 1016. In this case, when the voltage value of the feedback voltage is not obtained, the feedback signal adjustment unit 1013 continuously outputs the voltage value of an immediately preceding feedback voltage to the excitation signal adjustment unit 1016.

The excitation signal adjustment unit 1016 generates the drive current I from the generated triangular wave voltage signal, adds the feedback current If based on the feedback voltage supplied from the feedback signal adjustment unit 1013 and the offset current Ia generated from the adjustment signal generation unit 1100, and generates a triangular wave current signal which is an excitation signal to apply the generated signal to the exciting coil 52. Thereafter, the process of the excitation signal adjustment unit 1016 returns to step S11.

Step S20:

The feedback signal adjustment unit 1013 reads out the voltage value of the feedback voltage which is stored in the internal storage unit, and outputs the read-out voltage value to the data signal conversion unit 1015.

The data signal conversion unit 1015 amplifies the voltage value of the feedback voltage supplied from the feedback signal adjustment unit 1013 based on an amplification factor set in advance, and outputs the amplified voltage value, as a data signal, to the data signal determination unit.

Step S21:

The data signal determination unit 104 determines whether the voltage value indicating the data signal which is supplied from the data signal conversion unit 1015 is included in the data range which is stored in the internal storage unit. In this case, when the voltage value indicating the data signal is included in the data range, the process of the data signal determination unit 104 proceeds to step S22. On the other hand, when the voltage value indicating the data signal is not included in the data range, the process of the data signal determination unit 104 proceeds to step S23.

Step S22:

The data signal determination unit 104 outputs the data signal which is supplied from the data signal conversion unit 1015, to the external magnetic field intensity determination device.

As previously stated, the magnetic field intensity determination device reads out a magnetic field intensity corresponding to the voltage value indicating of the data signal which is supplied from the magnetic element control device 130, from the magnetic field intensity table which is stored in the internal storage unit, and cases a display unit to display the resultant to the magnetic field intensity determination device.

Step S23:

The data signal determination unit 104 discards the data signal supplied from the data signal conversion unit 1015, and outputs an error signal to the external magnetic field intensity determination device.

As previously stated, when the error signal is supplied from the magnetic element control device 130, the magnetic field intensity determination device causes a display unit of the magnetic field intensity determination device to display a notification indicating that the applied stationary magnetic field is disabled from being measured.

Step S26:

When the changeover switch is a magnetic proportional mode, the magnetic element control unit 131 sets the first analog switch 1021 to be in an electrical non-conduction state, and sets the second analog switch 1022 to be in an electrical conduction state.

Thereby, since the above changeover switch is configured to perform control on the basis of the magnetic proportion system, the feedback signal conversion unit 1014 outputs a voltage value indicating a magnetic field intensity to the data signal conversion unit 1015, on the basis of the difference Td which is supplied from the detection signal comparison unit 1012.

Step S27:

The feedback signal conversion unit 1014 obtains a voltage value indicating a magnetic field intensity on the basis of the difference Td which is supplied from the detection signal comparison unit 1012, and outputs the obtained voltage value to the data signal conversion unit 1015. The process of the feedback signal conversion unit 1014 proceeds to step S20.

The detection of the magnetic field intensity based on the magnetic proportion system is the same as that in the case of an example of the related art as described previously.

Figure 10:
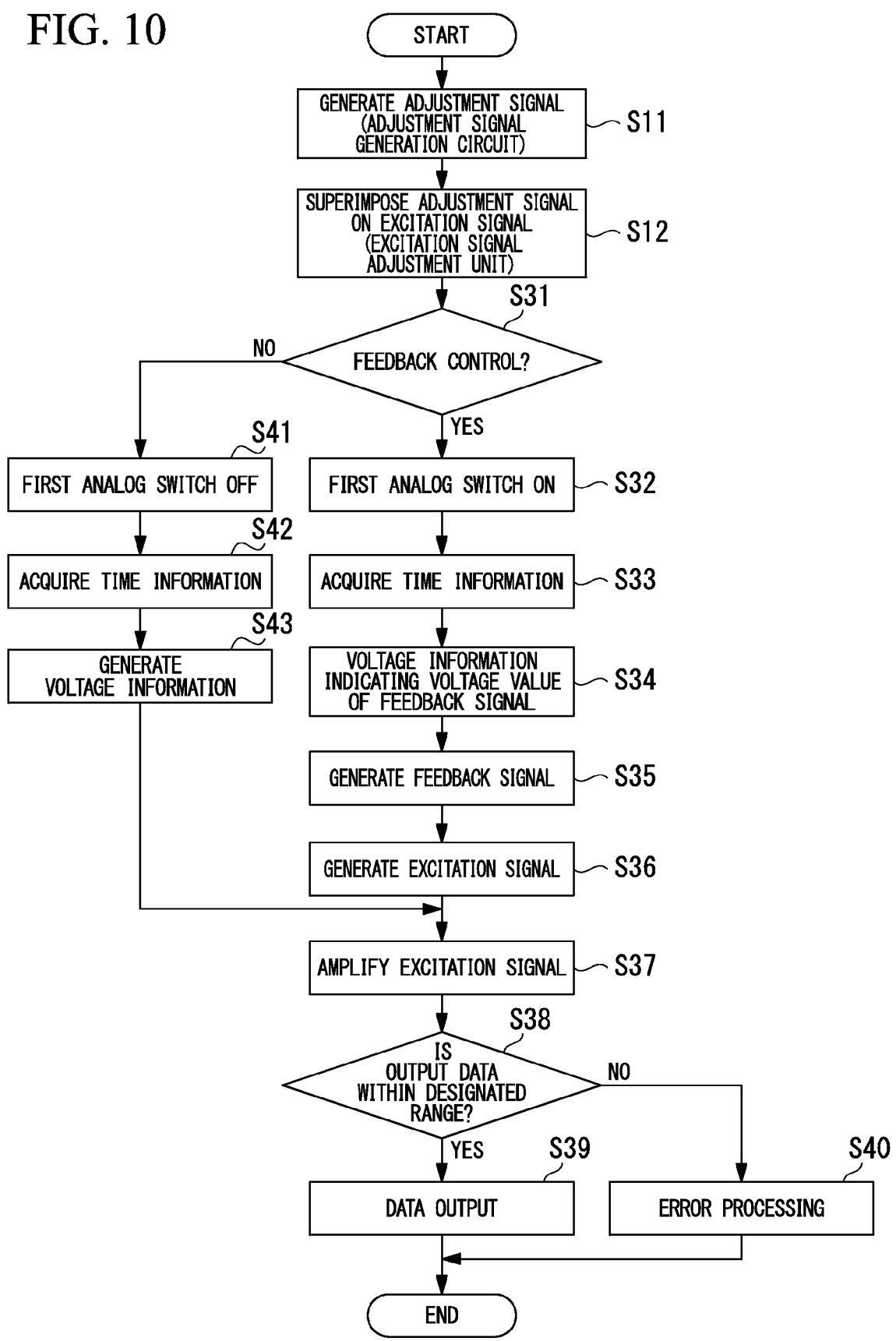
FIG. 10 is a flow diagram showing an operation example of magnetic element control processing (generation processing of a feedback voltage based on an analog value) performed by the magnetic element control device 130 according to the third embodiment.
Figure 11:
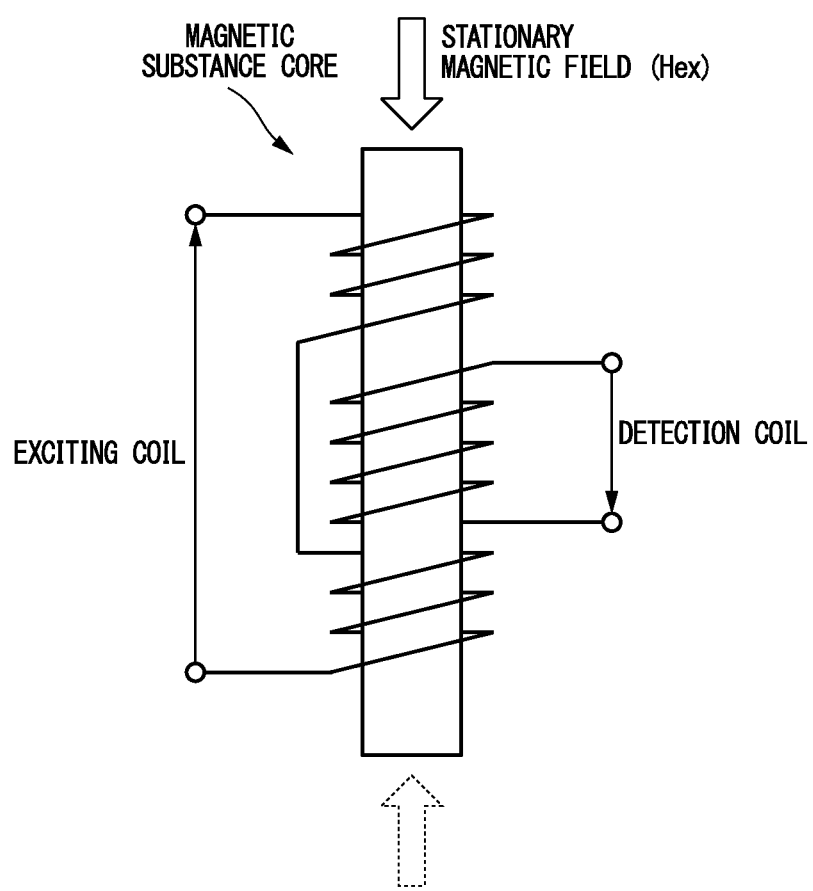
FIG. 11 is a diagram showing a configuration example of a time-resolution FG-type magnetic element (for magnetic proportion type measurement).
Figure 12:
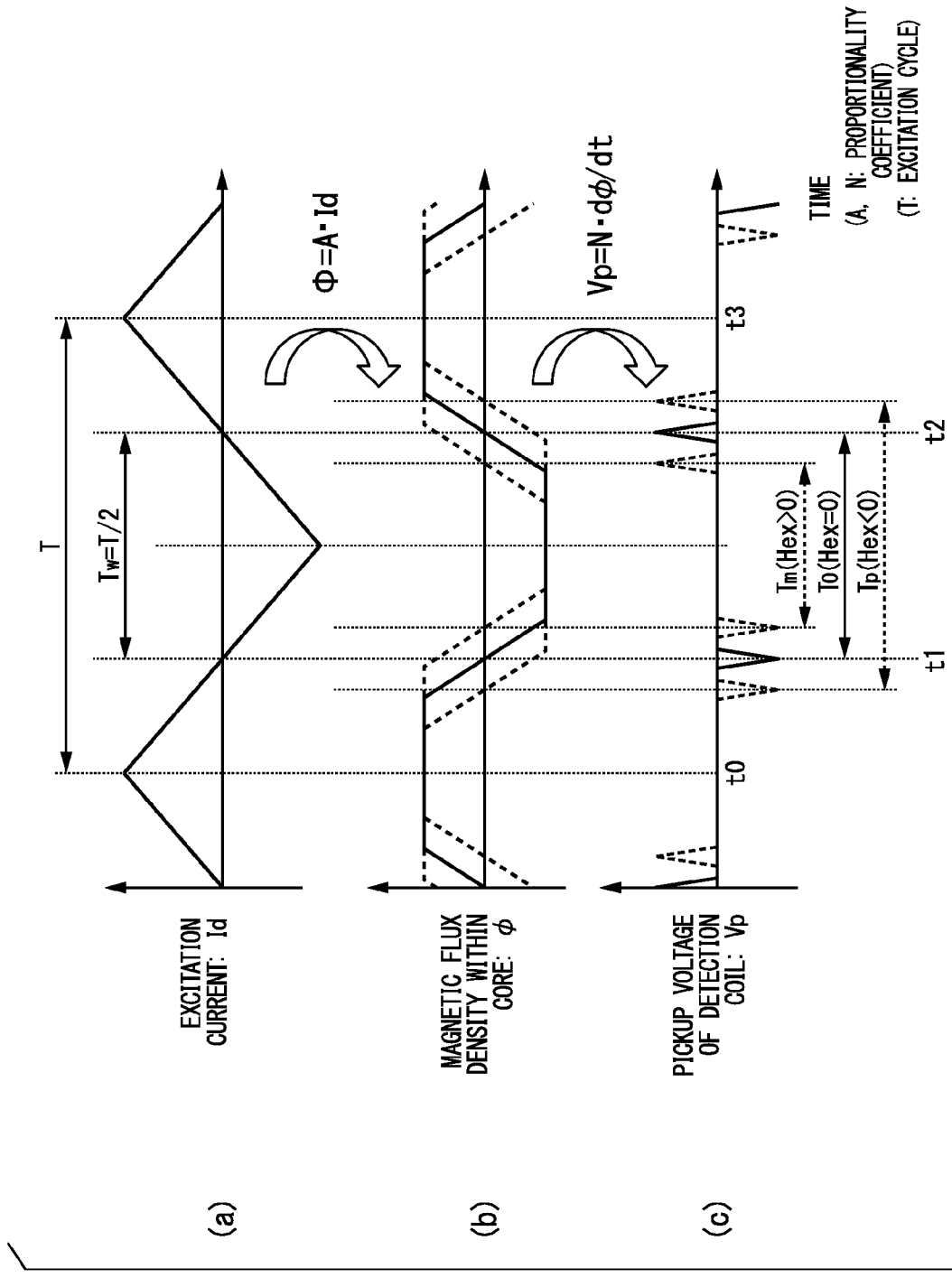
FIG. 12 is a waveform diagram showing a principle in which magnetism in a magnetic balance system is detected using the time-resolution FG-type magnetic element.
Figure 13:
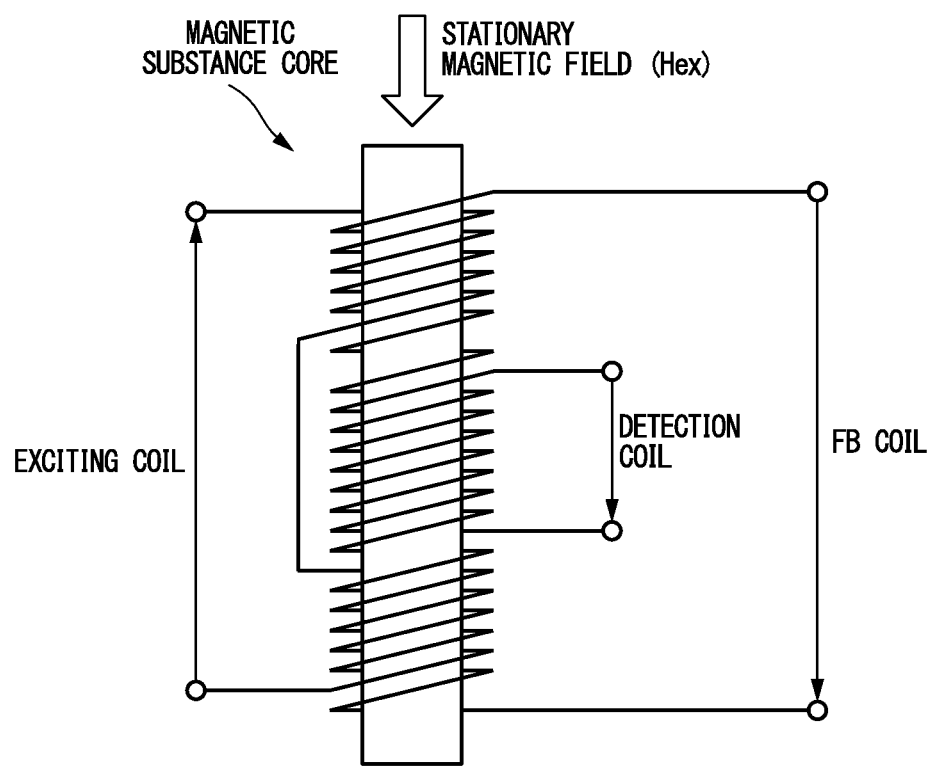
FIG. 13 is a diagram showing a configuration example of a time-resolution FG-type magnetic element (for magnetic balance type measurement).
Figure 14:
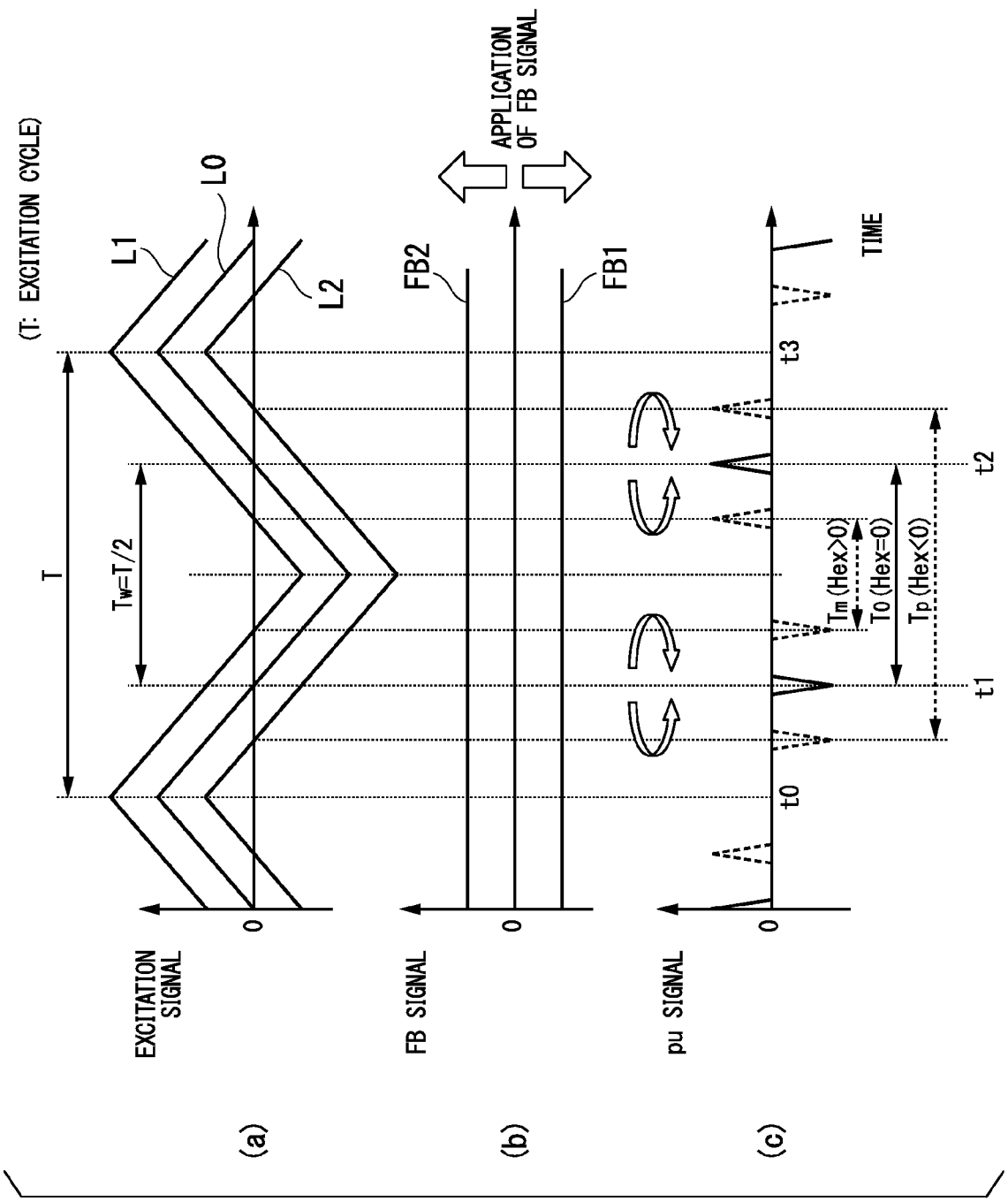
FIG. 14 is a waveform diagram showing a principle in which magnetism in a magnetic balance system is detected using the time-resolution FG-type magnetic element.
Figure 15:
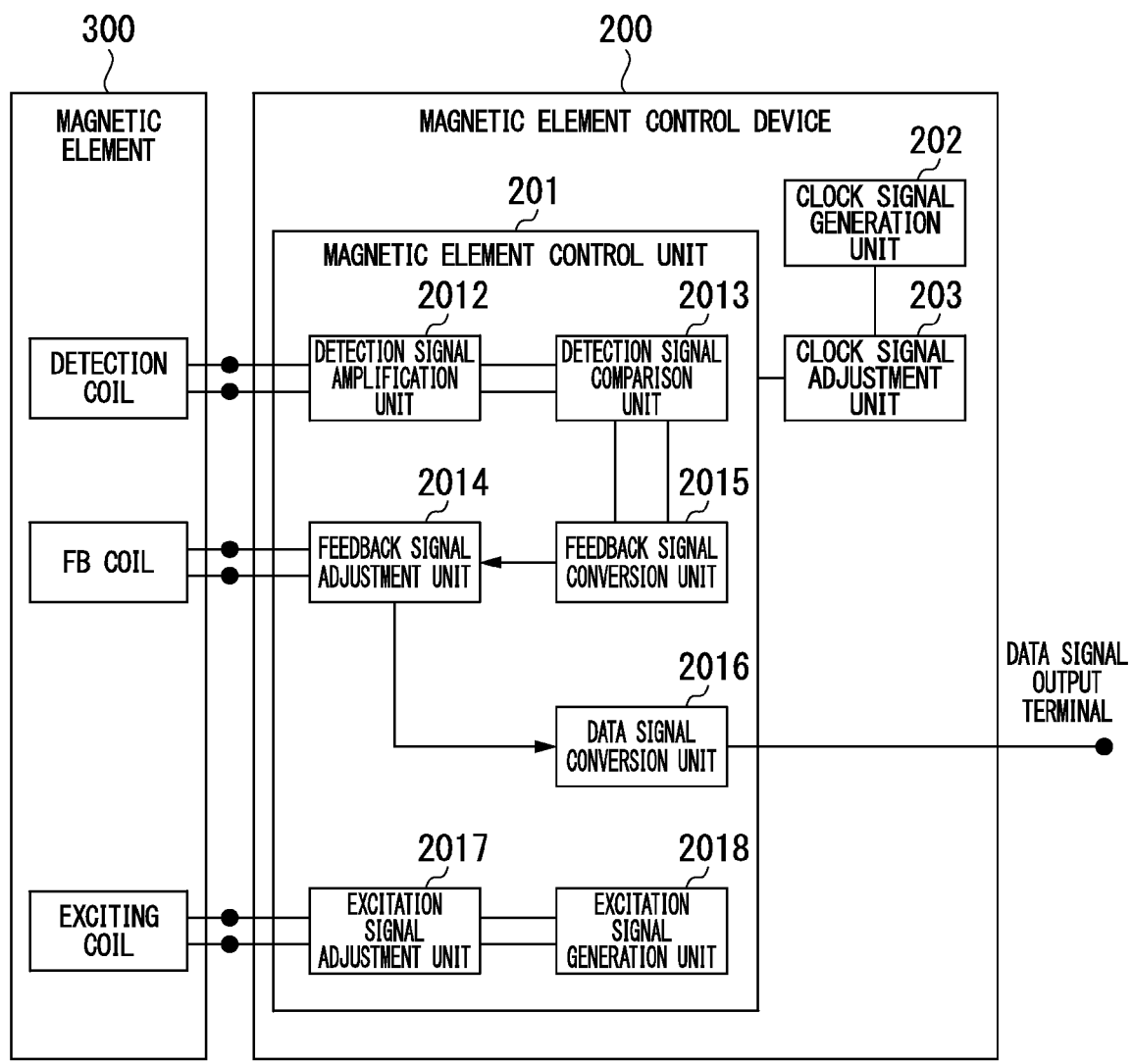
FIG. 15 is a block diagram showing a configuration example of a magnetic detection device using a magnetic element control device in FB control of an FB coil.

Next, another magnetic element control processing of the magnetic element control device 130 according to the third embodiment will be described with reference to FIGS. 8 and 10. FIG. 10 is a flow diagram showing of an operation example of magnetic element control processing (generation processing of a feedback voltage based on an analog value) performed by the magnetic element control device 130 according to the third embodiment. Steps S11 and S12 in FIG. 10 are the same as steps S11 and S12 in FIG. 5, respectively.

Step S11:

A user encases the magnetic detection device of the present embodiment in a magnetic shielding box, and obtains the offset voltage Va that cancels an offset superimposed on a data signal and the resistance value Ra of the variable resistor 1101.

A user controls the resistance value Ra of the variable resistor 1101, and gives the offset voltage Va from an external power supply (not shown) through the adjustment voltage input terminal to the adjustment signal generation unit 1100.

Step S12:

The adjustment signal generation unit 1100 converts the offset voltage Va into the offset current Ia through the variable resistor 1101.

The adjustment signal generation unit 1100 supplies the generated offset current Ia to the (−) terminal of the differential amplifier 2001.

The excitation signal adjustment unit 1016 adds the drive current I (current obtained by performing voltage-current conversion on the triangular wave voltage signal through the resistor 2002), the offset current Ia (current that cancels an offset which is supplied from the adjustment signal generation unit 1100), and the feedback current If (current obtained by performing voltage-current conversion on the feedback voltage through the resistor 2003) to obtain a current, and applies the obtained current to the exciting coil 52, as the triangular wave current signal which is an excitation current. That is, a periodic triangular wave current which is an excitation current obtained by superimposing the offset current Ia and the feedback current If on the drive current flows to the exciting coil 52.

Step S31:

The magnetic element control unit 131 detects either a state (magnetic balance system mode) indicating that the changeover switch uses the magnetic element control device 130 as the magnetic balance system, or a state (magnetic proportion system mode) indicating that the changeover switch uses the magnetic element control device 130 as the magnetic proportion system.

When the changeover switch is a magnetic balance system mode, the process of the magnetic element control unit 131 proceeds to step S32. On the other hand, when the changeover switch is a magnetic proportion system mode, the process proceeds to step S41.

Step S32:

When the changeover switch is a magnetic balance mode, the magnetic element control unit 131 sets the first analog switch 1021 to be in an electrical conduction state, and sets the second analog switch 1022 to be in an electrical non-conduction state.

Thereby, the magnetic element control device 130 includes a configuration in which a magnetic field intensity based on the magnetic balance system is determined.

Step S33:

The detection signal amplification unit 1011 amplifies a voltage between both ends of the detection coil 51, and outputs the amplified voltage to the detection signal comparison unit 1012.

The detection signal comparison unit 1012 outputs the first detection signal and the second detection signal which are detected, as time information, to the feedback signal conversion unit 1014.

Step S34:

When the detection signal is supplied, the feedback signal conversion unit 1014 generates a train of pulses (hereinafter, referred to as a pulse train) having a duty ratio as voltage information, on the basis of a cycle (time information) in which the first detection signal and the second detection signal are output, and outputs the pulse train having a duty ratio, as voltage information, to the feedback signal adjustment unit 1013.

Step S35:

The feedback signal adjustment unit 1013 generates a direct-current voltage using a PWM circuit or the like, through the supplied pulse train having a duty ratio, and outputs the generated voltage, as a feedback signal, to the excitation signal adjustment unit 1016.

That is, when a pulse which is voltage information is supplied, the feedback signal adjustment unit 1013 generates a feedback signal of a voltage value corresponding to the duty ratio of the pulse, and outputs the generated feedback signal to the excitation signal adjustment unit 1016 and the data signal conversion unit 1015.

Here, the feedback signal adjustment unit 1013 is provided with a voltage-to-current conversion circuit which is configured using, for example, an operational amplifier. In the voltage-to-current conversion circuit, since an amplifier having an operational amplifier function is used, and the amplifier functions so that a potential difference between a positive input and a negative input is maintained to be zero, a current signal from the output of the amplifier to the positive input thereof has a proportional relation to an external magnetic field. By applying a signal proportional to the current signal, as a feedback signal, to the exciting coil 52, a magnetic field based on the feedback signal is generated, and a magnetic field which is applied to a magnetic substance core within the magnetic element 50 is adjusted so as to become constant. As a result, it is possible to hold the time interval between the first detection signal and the second detection signal constant without depending on an external stationary magnetic field.

Step S36:

The excitation signal adjustment unit 1016 generates the drive current I from the generated triangular wave voltage signal, adds the feedback current If based on the feedback voltage supplied from the feedback signal adjustment unit 1013 and the offset current Ia generated from the adjustment signal generation unit 1100, and generates a triangular wave current signal which is an excitation signal to apply the generated signal to the exciting coil 52.

Step S37:

The data signal conversion unit 1015 amplifies the voltage value of the feedback signal supplied from the feedback signal adjustment unit 1013 based on an amplification factor which is set in advance, and outputs the amplified voltage value, as a data signal, to the data signal determination unit 104.

Step S38:

The data signal determination unit 104 determines whether the voltage value indicating of the data signal which is supplied from the data signal conversion unit 1015 is included in the data range specified by two threshold voltages which are set in an internal determination circuit. In this case, when the voltage value indicating the data signal is included in the data range, the process of the data signal determination unit 104 proceeds to step S39. On the other hand, when the voltage value indicating the data signal is not included in the data range, the process of the data signal determination unit 104 proceeds to step S40.

Step S39:

The data signal determination unit 104 outputs the data signal which is supplied from the data signal conversion unit 1015, to the external magnetic field intensity determination device.

As previously stated, the magnetic field intensity determination device converts the voltage of a data signal into a digital value through A/D conversion, reads out a magnetic field intensity corresponding to the voltage value indicating the data signal supplied from the magnetic element control device 130, from the magnetic field intensity table which is stored in the internal storage unit, using the converted digital value, and causes a display unit of the magnetic field intensity determination device to display the resultant.

Step S40:

The data signal determination unit 104 discards the data signal supplied from the data signal conversion unit 1015, and outputs an error signal to the external magnetic field intensity determination device.

As previously stated, when the error signal is supplied from the magnetic element control device 130, the magnetic field intensity determination device causes a display unit of the magnetic field intensity determination device to display a notification indicating that the applied stationary magnetic field is not capable of being measured.

Step S41:

When the changeover switch is a magnetic proportional mode, the magnetic element control unit 131 sets the first analog switch 1021 to be in an electrical non-conduction state, and sets the second analog switch 1022 to be in an electrical conduction state.

Thereby, since the above changeover switch is configured to perform control on the basis of the magnetic proportion system, the feedback signal conversion unit 1014 outputs a voltage value indicating a magnetic field intensity to the data signal conversion unit 1015, on the basis of the difference Td which is supplied from the detection signal comparison unit 1012.

Step S42:

The detection signal amplification unit 1011 amplifies a voltage between both ends of the detection coil 51, and outputs the amplified voltage to the detection signal comparison unit 1012.

The detection signal comparison unit 1012 outputs the first detection signal and the second detection signal which are detected, as time information, to the feedback signal conversion unit 1014.

Step S43:

When the detection signal is supplied, the feedback signal conversion unit 1014 generates a train of pulses (hereinafter, referred to as a pulse train) having a duty ratio as voltage information, on the basis of a cycle (time information) in which the first detection signal and the second detection signal are output, and outputs the pulse train having a duty ratio, as voltage information, to the data signal conversion unit 1015.

The data signal conversion unit 1015 generates a direct-current voltage, using a PWM circuit or the like, through the supplied pulse train having a duty ratio, and sets the generated voltage as the measurement voltage. The process of the data signal conversion unit 1015 proceeds to step S37. In step S37, the process as described previously is performed using the measurement voltage as a feedback signal.

In the above-mentioned third embodiment, the electrical conduction states of the first analog switch 1021 and the second analog switch 1022 are controlled, thereby allowing the magnetic element control device 130 to be used by switching between any of the configuration for magnetic field measurement based on the magnetic balance system, and the configuration of magnetic field measurement based on the magnetic proportion system.

In the third embodiment, the magnetic element control unit 131 sets the first analog switch 1021 to be in an electrical non-conduction state, and sets the second analog switch 1022 to be in an electrical conduction state. Thereby, without superimposing the feedback signal on the triangular wave voltage signal, that is, without superimposing the feedback signal that cancels a stationary magnetic field applied to the magnetic element 50 on the excitation signal, a configuration in which a voltage which cancels out a stationary magnetic field is directly converted, as a measurement voltage, into a magnetic field intensity is realized by a simple circuit.

In the case of magnetic field measurement based on the magnetic proportion system, good linearity is obtained between the magnetic field and the measured voltage in consideration of the measurement of a stationary magnetic field to be measured, corresponding to a measurement magnetic field range restricted by the excitation current and the excitation efficiency. Further, since an FB signal is not required to be generated when a stationary magnetic field within the measurement magnetic field range in the magnetic proportion system is measured, it is possible to suppress a consumption current.

In addition, in the case of magnetic field measurement based on the magnetic proportion system, the reference potential of the excitation signal adjustment unit 1016 which is, for example, an output signal generation circuit is set to a potential different from the reference potential of the excitation signal generation unit 1017 in order to avoid crossover distortion caused by the characteristics of an operational amplifier used in the excitation signal generation unit 1017. Thereby, the generation time zone of crossover distortion for an excitation triangular wave is relatively moved, and thus the generation time zone of the crossover distortion and the generation time zone of the detection signal do not overlap each other in a desired magnetic field range. Therefore, linearity having good sensitivity is obtained.

On the other hand, when a magnetic field in a large measurement magnetic field range, that is, a range having a magnetic field intensity larger than that in a measurement magnetic field range of the magnetic proportion system is measured, it is necessary to measure a magnetic field using the magnetic balance system, as is the case with the first embodiment and the second embodiment. Linearity between the magnetic field and the feedback signal can be obtained in a large range of a magnetic field intensity, using the magnetic balance system.

As is the case with the first embodiment and the second embodiment described previously, processing until the feedback signal adjustment unit 1013 may be performed by arithmetic operation processing using a digital value, that is, voltage information of a digital value indicating the voltage value of the feedback signal may be supplied, as the feedback signal, from the feedback signal adjustment unit 1013 to the excitation signal adjustment unit 1016.

In this case, the excitation signal generation unit 1017 outputs a triangular wave to the excitation signal adjustment unit 1016 using a digital value.

With such a configuration, as is the case with the second embodiment, the excitation signal adjustment unit 1016 may add and superimpose a feedback signal onto the triangular wave voltage signal in synchronization with a clock signal which is output by the clock signal adjustment unit 103 to obtain a signal, and may generate an excitation signal by performing D/A conversion on the obtained signal.

Here, a measurement cycle having any time width is generated in synchronization with the clock signal, a period in which measurement processing is performed by applying the excitation signal to the exciting coil 52 and a period in which measurement is not performed by stopping the application of the excitation signal to the exciting coil 52 are alternately provided, and the exciting coil 52 is intermittently operated.

Thereby, the generation of heat in the magnetic element 50 itself is suppressed, and a change in temperature is reduced, thereby allowing a magnetic field intensity to be measured with a higher degree of accuracy. In addition, it is possible to achieve a reduction in average consumption current.

Further, as is the case with the second embodiment, exciting coils of a plurality of magnetic elements are driven in order using the function of an intermittent operation, and thus a stationary magnetic field can be measured by one magnetic element control device and a plurality of magnetic elements.

For example, magnetic elements are provides so that the respective measurement axes of three magnetic elements, that is, three axes of an x-axis, a y-axis and a z-axis are at right angles to each other, and thus can be used in the control of magnetic elements of other axes that measures the magnetic field intensity and the direction of a magnetic field in a three-dimensional space.

In addition, programs for realizing each function (arithmetic operation processing of generating a feedback signal based on a digital value) of the magnetic element control unit 101 of FIG. 1, the magnetic element control unit 111 of FIG. 7, and the magnetic element control unit 131 of FIG. 8 are recorded in a computer readable recording medium, and thus processing of magnetic element control may be performed by causing a computer system to read and execute the programs recorded in this recording medium. Meanwhile, the term "computer system" as used herein includes an OS or hardware such as peripheral devices.

In addition, the "computer system" also includes a homepage providing environment (or a display environment) when a WWW system is use.

In addition, the term "computer readable recording medium" refers to a flexible disk, a magneto-optic disc, a ROM, a portable medium such as a CD-ROM, and a storage device such as a hard disk built in the computer system. Further, the "computer readable recording medium" includes recording mediums that dynamically hold a program during a short period of time like networks such as the Internet or communication lines when a program is transmitted through communication lines such as a telephone line, and recording mediums that hold a program for a certain period of time like a volatile memory inside a computer system serving as a server or a client in that case. In addition the above-mentioned program may be a program which is used for realizing a portion of the aforementioned functions, and is capable of realizing the aforementioned functions by a combination of programs previously recorded in the computer system.

As stated above, the embodiments of the present invention have been described in detail with the accompanying drawings, but specific configurations are not limited to the above embodiments, and may include designs and configurations without departing from the scope of the present invention.

What is claimed is:

1. A magnetic element control device that controls a fluxgate type magnetic element when an intensity of a stationary magnetic field which is applied to the magnetic element having an exciting coil and a detection coil is detected using a time-resolution magnetic balance system, comprising:
    an excitation signal generation unit that generates an alternating signal;
    a detection signal comparison unit that detects a detection signal of a positive voltage or a negative voltage which is generated at the detection coil by an induced electromotive force when a direction of an excitation current which flows to the excitation coil switches;
    a feedback signal conversion unit that converts a time width between detection signals of the positive voltage and the negative voltage into voltage information;
    a feedback signal adjustment unit that generates a feedback signal that generates a magnetic field that cancels out the stationary magnetic field which is applied to the magnetic element, from the voltage information;
    a data signal conversion unit that outputs the feedback signal as a data signal indicating a magnetic field intensity;
    an adjustment signal generation unit that generates an offset signal that cancels an offset component which is superimposed on the data signal; and
    an excitation signal adjustment unit that generates an alternating current, a feedback current, and an offset current from the alternating signal, the feedback signal, and the offset signal, respectively, superimposes the feedback current and the offset current on the alternating current, and generates the excitation current which is applied to the exciting coil.

2. The magnetic element control device according to claim 1, wherein the offset signal is set to a voltage which cancels out the offset component which is a difference between a data signal measured in a zero magnetic field and an expectation value of a data signal on a design in the zero magnetic field.

3. The magnetic element control device according to claim 1, wherein the excitation signal adjustment unit includes a differential amplifier which is configured such that a terminal of the exciting coil is connected to an inverting input terminal and an output terminal, and a reference voltage is applied to a non-inverting input terminal, and the alternating current, the feedback current and the offset current are applied to the inverting input terminal, and the differential amplifier is configured to cause an excitation current obtained by adding the alternating current, the feedback current and the offset current to flow from the output terminal to the exciting coil.

4. The magnetic element control device according to claim 3 further comprising a temperature sensor, wherein the adjustment signal generation unit is configured to perform control on the basis of a temperature measured by the temperature sensor so that the offset current becomes equal to a current value which is set to an initial value, regardless of the temperature.

5. The magnetic element control device according to claim 4, wherein the excitation signal adjustment unit is configured to multiply the alternating signal by a coefficient corresponding to the temperature to correct the alternating signal, superimpose the feedback current on an alternating current determined from the alternating signal after the correction, and supply the superimposed signal, as the excitation current, to the exciting coil.

6. The magnetic element control device according to claim 4, wherein the excitation signal generation unit is configured to adjust a cycle of the alternating signal in response to the coefficient corresponding to the temperature, superimpose the feedback current on an alternating current generated from the alternating signal after the adjustment, and supply the superimposed signal, as the excitation current, to the exciting coil.

7. The magnetic element control device according to claim 1, wherein when a mode in which an intensity of a magnetic field is detected is selected using a time-resolution magnetic proportion system, the feedback signal adjustment unit is configured to set a voltage value of the feedback signal to 0 V and supplies the voltage value to the excitation signal adjustment unit, and the feedback signal conversion unit outputs the time width as measurement data of the stationary magnetic field.

8. The magnetic element control device according to claim 1, further comprising:

a clock signal generation unit that generates a periodic clock signal; and an excitation signal generation unit that generates a triangular wave signal as the alternating signal synchronized with the clock signal.

9. A magnetic element control method of controlling a flux-gate type magnetic element when an intensity of a stationary magnetic field which is applied to the magnetic element having an exciting coil and a detection coil is detected using a time-resolution magnetic balance system, comprising:

an excitation signal generation process of generating an alternating signal;

a detection signal comparison process of detecting a detection signal of a positive voltage or a negative voltage which is generated at the detection coil by an induced electromotive force when a direction of an excitation current which flows to the exciting coil switches;

a feedback signal conversion process of converting a time width between detection signals of the positive voltage and the negative voltage into voltage information;

a feedback signal adjustment process of generating a feedback signal that generates a magnetic field that cancels out the stationary magnetic field which is applied to the magnetic element, from the voltage information;

a data signal conversion process of outputting the feedback signal as a data signal indicating a magnetic field intensity;

an adjustment signal generation process of generating an offset signal that cancels an offset component which is superimposed on the data signal; and an excitation signal adjustment process of generating an alternating current, a feedback current, and an offset current from the alternating signal, the feedback signal, and the offset signal, respectively, superimposing the feedback current and the offset current on the alternating current, and generating the excitation current which is applied to the exciting coil.

10. A magnetic detection device, based on a magnetic balance system, which detects an intensity of a stationary magnetic field to be applied, comprising:

a flux-gate type magnetic element having an exciting coil and a detection coil;

an excitation signal generation unit that generates an alternating signal;

a detection signal comparison unit that detects a detection signal of a positive voltage or a negative voltage which is generated at the detection coil by an induced electromotive force when a direction of an excitation current which flows to the exciting coil switches;

a feedback signal conversion unit that converts a time width between detection signals of the positive voltage and the negative voltage into voltage information;

a feedback signal adjustment unit that generates a feedback signal that generates a magnetic field that cancels out the stationary magnetic field which is applied to the magnetic element, from the voltage information;

an adjustment signal generation unit that generates an offset signal that cancels an offset component which is superimposed on the data signal;

an excitation signal adjustment unit that generates an alternating current, a feedback current, and an offset current from the alternating signal, the feedback signal, and the offset signal, respectively, superimposes the feedback current and the offset current on the alternating current, and generates the excitation current which is applied to the exciting coil; and a data signal conversion unit that outputs the feedback signal as a data signal indicating a magnetic field intensity.

\* \* \* \* \*